(12) United States Patent
Decamp et al.

(10) Patent No.: US 10,663,498 B2
(45) Date of Patent: *May 26, 2020

(54) SYSTEMS, METHODS AND DEVICES FOR REMOTE POWER MANAGEMENT AND DISCOVERY

(71) Applicant: TARGUS INTERNATIONAL LLC, Anaheim, CA (US)

(72) Inventors: Ronald Decamp, Long Beach, CA (US); Dan Tsang, Carlsbad, CA (US); David Kai Bong Mak, Rhodes (AU); Paul Dale, Rhodes (AU); Jay Turner, Rhodes (AU)

(73) Assignees: Targus International LLC, Anaheim, CA (US); Targus Group (UK) LTD, Middlesex (GB)

( * ) Notice: Subject to any disclaimer, the term of this patent is extended or adjusted under 35 U.S.C. 154(b) by 0 days.

This patent is subject to a terminal disclaimer.

(21) Appl. No.: 15/655,699

(22) Filed: Jul. 20, 2017

(65) Prior Publication Data
US 2019/0025353 A1   Jan. 24, 2019

(51) Int. Cl.
*G01R 21/00*   (2006.01)
*G01R 21/133*   (2006.01)
(Continued)

(52) U.S. Cl.
CPC ........... *G01R 21/133* (2013.01); *G05B 15/02* (2013.01); *G06F 1/266* (2013.01);
(Continued)

(58) Field of Classification Search
None
See application file for complete search history.

(56) References Cited

U.S. PATENT DOCUMENTS 5,835,733 A   11/1998   Walsh et al.
5,886,424 A   3/1999   Kim
(Continued)

FOREIGN PATENT DOCUMENTS

AU   2014100171 A4   3/2014
CN   101893916 A   11/2010
(Continued)

OTHER PUBLICATIONS

Final Office Action for U.S. Appl. No. 15/261,204, filed Sep. 9, 2016, and mailed from the USPTO dated Nov. 2, 2018.
(Continued)

*Primary Examiner* — Paul B Yanchus, III
(74) *Attorney, Agent, or Firm* — Stoel Rives LLP

(57) ABSTRACT

A power monitoring device (PMD) can perform real-time remote managing, status reporting and analysis on the health/condition of equipment connected to the PMD. For example, a PMD provides data such as whether the equipment connected is idling, fully operating, malfunctioning, etc. The PMD can turn the power on/off, trigger system alert, and perform time-delayed or special profile programming to manage and monitor equipment usage. A power signature identification capability can identify what equipment such as monitor, laptop, lighting equipment, etc., are being connected. A configuration can be used by the power management device based at least in part on the waveform information (e.g., device model, activity status, etc.). Real-time diagnosis and collection of energy consumption and usage pattern can be aggregated for planning and management. Asset management can be enabled by discovering which models of devices are active and connected to a predetermined power management device.

24 Claims, 28 Drawing Sheets

(51) Int. Cl.
  *H04L 12/24* (2006.01)
  *G06F 1/26* (2006.01)
  *G05B 15/02* (2006.01)
  *H04L 12/26* (2006.01)
  *H04L 29/08* (2006.01)

(52) U.S. Cl.
  CPC .......... *H04L 41/0833* (2013.01); *H04L 43/50* (2013.01); *H04L 67/125* (2013.01)

(56) References Cited

U.S. PATENT DOCUMENTS

| | | |
|---|---|---|
| 6,170,026 B1 | 1/2001 | Kimura et al. |
| 6,604,199 B1 | 8/2003 | Yang et al. |
| 6,629,182 B1 | 9/2003 | Mizoguchi et al. |
| 6,804,740 B1 | 10/2004 | Watts et al. |
| 6,888,338 B1 | 5/2005 | Popescu-Stanesti et al. |
| 6,976,885 B2 | 12/2005 | Lord |
| 7,035,126 B1 | 4/2006 | Lanni |
| 7,103,760 B1 | 9/2006 | Billington et al. |
| 7,171,461 B2 | 1/2007 | Ewing et al. |
| 7,201,611 B2 | 4/2007 | Faranda |
| 7,403,232 B1 | 7/2008 | Orlicki et al. |
| 7,643,283 B2 | 1/2010 | Jubelirer et al. |
| 7,681,134 B1 | 3/2010 | Grechishkin et al. |
| 7,683,573 B2 | 3/2010 | Nikazm et al. |
| 7,899,970 B2 | 3/2011 | Mori |
| 7,976,337 B1 | 7/2011 | Cortopassi et al. |
| 8,346,753 B2 | 1/2013 | Hayes |
| 8,395,605 B2 | 3/2013 | Sisto et al. |
| 8,799,537 B1 | 8/2014 | Zhu et al. |
| 8,990,469 B2 | 3/2015 | Benhard et al. |
| 9,304,545 B2 | 4/2016 | Ramirez et al. |
| 9,338,268 B2 | 5/2016 | Holtman |
| 9,377,814 B2 | 6/2016 | Ramirez et al. |
| 9,647,481 B2 | 5/2017 | Huang et al. |
| 2002/0119800 A1 | 8/2002 | Jaggers et al. |
| 2003/0084222 A1 | 5/2003 | Wurzburg |
| 2003/0107566 A1 | 6/2003 | Shin et al. |
| 2004/0064621 A1 | 4/2004 | Dougherty et al. |
| 2004/0088465 A1 | 5/2004 | Bianchi |
| 2004/0095713 A1 | 5/2004 | Chuang |
| 2004/0116149 A1 | 6/2004 | Yukie et al. |
| 2004/0125777 A1 | 7/2004 | Doyle et al. |
| 2004/0212586 A1 | 10/2004 | Denny |
| 2004/0268163 A1 | 12/2004 | Yeh |
| 2005/0033481 A1 | 2/2005 | Budhraja et al. |
| 2005/0162824 A1 | 7/2005 | Thompson |
| 2005/0164545 A1 | 7/2005 | Rosenthal et al. |
| 2005/0180086 A1 | 8/2005 | Schaefer et al. |
| 2006/0005055 A1 | 1/2006 | Potega |
| 2006/0075286 A1 | 4/2006 | Hodge et al. |
| 2006/0095641 A1 | 5/2006 | Pandit et al. |
| 2006/0103504 A1 | 5/2006 | Vassallo |
| 2006/0123807 A1 | 6/2006 | Sullivan et al. |
| 2006/0161713 A1 | 7/2006 | Belady |
| 2006/0205381 A1 | 9/2006 | Beart et al. |
| 2006/0250764 A1 | 11/2006 | Howarth et al. |
| 2006/0250765 A1 | 11/2006 | Howarth et al. |
| 2007/0030276 A1 | 2/2007 | MacInnis et al. |
| 2007/0033289 A1 | 2/2007 | Nuyttens et al. |
| 2007/0065078 A1 | 3/2007 | Jiang |
| 2007/0070598 A1 | 3/2007 | Chuang |
| 2007/0101039 A1 | 5/2007 | Rutledge et al. |
| 2007/0120874 A1 | 5/2007 | MacInnis et al. |
| 2007/0168593 A1 | 7/2007 | Montag et al. |
| 2008/0053770 A1 | 3/2008 | Tynyk |
| 2008/0119241 A1 | 5/2008 | Dorogusker et al. |
| 2008/0126594 A1 | 5/2008 | Monks et al. |
| 2008/0194119 A1 | 8/2008 | Mori |
| 2008/0239681 A1 | 10/2008 | Iida |
| 2009/0058359 A1 | 3/2009 | Fischer et al. |
| 2009/0066704 A1 | 3/2009 | Daniel et al. |
| 2009/0072782 A1 | 3/2009 | Randall |
| 2009/0079264 A1 | 3/2009 | Minami |
| 2009/0079416 A1 | 3/2009 | Vinden et al. |
| 2009/0158423 A1 | 6/2009 | Orlassino et al. |
| 2009/0228614 A1 | 9/2009 | Hwang |
| 2009/0247006 A1 | 10/2009 | Thompson |
| 2009/0309748 A1 | 12/2009 | Elgort et al. |
| 2010/0037283 A1 | 2/2010 | Zhu |
| 2010/0066685 A1 | 3/2010 | Cain et al. |
| 2010/0070217 A1* | 3/2010 | Shimada ................ G01D 4/008 702/62 |
| 2010/0081473 A1 | 4/2010 | Chatterjee et al. |
| 2010/0128766 A1 | 5/2010 | Sugita |
| 2010/0174419 A1* | 7/2010 | Brumfield ............. G01R 22/10 700/295 |
| 2010/0188808 A1 | 7/2010 | Howarth et al. |
| 2010/0191487 A1 | 7/2010 | Rada et al. |
| 2010/0251361 A1 | 9/2010 | Collopy et al. |
| 2010/0259213 A1 | 10/2010 | Maharaj |
| 2010/0295384 A1 | 11/2010 | Kobayashi |
| 2010/0302454 A1 | 12/2010 | Epstein et al. |
| 2011/0001486 A1* | 1/2011 | Abouda ............... G01R 31/007 324/537 |
| 2011/0105226 A1 | 5/2011 | Perlman |
| 2011/0145466 A1 | 6/2011 | Supran et al. |
| 2011/0179291 A1 | 7/2011 | Weng et al. |
| 2011/0204843 A1 | 8/2011 | Foster |
| 2011/0208980 A1 | 8/2011 | Brooks et al. |
| 2011/0239008 A1 | 9/2011 | Lam et al. |
| 2011/0266997 A1 | 11/2011 | Krancher et al. |
| 2012/0034951 A1 | 2/2012 | Jones et al. |
| 2012/0054400 A1 | 3/2012 | Iverson et al. |
| 2012/0068538 A1 | 3/2012 | Ye et al. |
| 2012/0081087 A1 | 4/2012 | Ching-Wei |
| 2012/0110360 A1 | 5/2012 | Lin et al. |
| 2012/0155013 A1 | 6/2012 | Huang |
| 2012/0203949 A1 | 8/2012 | Benhard et al. |
| 2012/0229076 A1 | 9/2012 | Zhu et al. |
| 2012/0275526 A1 | 11/2012 | Hughes |
| 2012/0314777 A1 | 12/2012 | Zhang et al. |
| 2013/0050216 A1 | 2/2013 | Whitby-Strevens et al. |
| 2013/0054348 A1 | 2/2013 | Holsman et al. |
| 2013/0057567 A1 | 3/2013 | Frank et al. |
| 2013/0060662 A1 | 3/2013 | Carlson et al. |
| 2013/0159756 A1* | 6/2013 | Ellis ........................ H02J 3/00 713/340 |
| 2013/0205060 A1 | 8/2013 | Benhard et al. |
| 2013/0311801 A1 | 11/2013 | Kong et al. |
| 2014/0117780 A1 | 5/2014 | Buchheim et al. |
| 2014/0136749 A1 | 5/2014 | North et al. |
| 2014/0181350 A1 | 6/2014 | Pedro et al. |
| 2014/0208134 A1 | 7/2014 | Waters et al. |
| 2014/0244869 A1 | 8/2014 | Adrian et al. |
| 2014/0301575 A1 | 10/2014 | Holtman et al. |
| 2014/0342669 A1 | 11/2014 | Zeung et al. |
| 2014/0359318 A1 | 12/2014 | Liu et al. |
| 2015/0006026 A1* | 1/2015 | Schaffer ............... B60R 16/03 701/36 |
| 2015/0036051 A1 | 2/2015 | Broberg et al. |
| 2015/0046623 A1 | 2/2015 | Ramirez et al. |
| 2015/0082061 A1 | 3/2015 | Ramirez et al. |
| 2015/0106814 A1 | 4/2015 | Vilke et al. |
| 2015/0169477 A1 | 6/2015 | Beel et al. |
| 2015/0237191 A1 | 8/2015 | Moran et al. |
| 2015/0295440 A1 | 10/2015 | Liao |
| 2015/0346792 A1 | 12/2015 | Rathi et al. |
| 2015/0356045 A1 | 12/2015 | Soffer |
| 2015/0370681 A1* | 12/2015 | Tonry ................. G06F 11/3062 702/58 |
| 2015/0378420 A1 | 12/2015 | Ippolito et al. |
| 2016/0173678 A1 | 6/2016 | DeCamp |
| 2016/0187963 A1 | 6/2016 | Leinonen et al. |
| 2016/0193932 A1 | 7/2016 | Pedram |
| 2016/0285310 A1 | 9/2016 | Tan et al. |
| 2017/0024197 A1 | 1/2017 | Pantelka et al. |
| 2017/0140235 A1 | 5/2017 | Yu et al. |

(56) References Cited

U.S. PATENT DOCUMENTS

| | | |
|---|---|---|
| 2019/0025354 A1 | 1/2019 | Decamp |
| 2019/0025355 A1 | 1/2019 | Decamp |

FOREIGN PATENT DOCUMENTS

| | | |
|---|---|---|
| CN | 104094187 | 10/2014 |
| CN | 104838558 | 8/2015 |
| CN | 105593782 | 5/2016 |
| CN | 106707834 | 5/2017 |
| DE | 102013104216 | 11/2013 |
| EP | 1085400 A2 | 3/2001 |
| EP | 2823372 | 1/2015 |
| EP | 2929613 | 10/2015 |
| EP | 3030948 | 6/2016 |
| EP | 3087476 | 11/2016 |
| GB | 2457252 A | 8/2009 |
| GB | 2513197 A | 10/2014 |
| IN | 201617004084 | 12/2015 |
| IN | 201406041 | 1/2016 |
| JP | 2013239178 | 11/2013 |
| JP | 6110878 | 5/2015 |
| JP | 2016504900 | 2/2016 |
| KR | 101452319 | 10/2014 |
| KR | 20150091362 | 8/2015 |
| RU | 2630376 | 7/2017 |
| TW | 201347581 | 11/2013 |
| WO | 03030304 A2 | 4/2003 |
| WO | 2005003983 A1 | 1/2005 |
| WO | 2008109193 A1 | 9/2008 |
| WO | 2011138581 A2 | 11/2011 |
| WO | 2013024855 A1 | 2/2013 |
| WO | 2013033573 A2 | 3/2013 |
| WO | 2016011566 A1 | 1/2016 |
| WO | 2019018007 | 1/2019 |

OTHER PUBLICATIONS

Non-Final Office Action for U.S. Appl. No. 15/905,241, filed Feb. 26, 2018, and mailed from the USPTO dated Nov. 2, 2018.
Non-Final Office Action for U.S. Appl. No. 16/029,339, filed Jul. 6, 2018, and mailed from the USPTO dated Nov. 2, 2018.
Ganesh T S, "Visible Energy UFO Power Center Smart Power Strip Review", AnandTech, http://www.anandtech.com/show/6413/visible-energy-ufo-power-center-smart-power-stripreview, Oct. 26, 2012.
Dong, Wei , "Web-based Building Energy Consumption Monitoring and Conservation Service", 4th International Conference on Mechatronics, Materials, Chemistry and Computer Engineering (ICMMCCE 2015).
Advisory Action dated Sep. 28, 2017 in U.S. Appl. No. 14/970,318.
Final Office Action for U.S. Appl. No. 13/365,754, filed Feb. 3, 2012, and mailed from the USPTO dated Dec. 27, 2013, 18 pgs.
Final Office Action for U.S. Appl. No. 13/365,754, filed Feb. 3, 2012, and mailed from the USPTO dated Jun. 10, 2014, 22 pgs.
Final Office Action for U.S. Appl. No. 14/970,318, filed Dec. 15, 2015, and mailed from the USPTO dated Jul. 11, 2017.
Final Office Action dated Aug. 9, 2017 in U.S. Appl. No. 14/923,833.
Fink, Thomas, "Toshiba Dynadock V Review," Aug. 9, 2010, Laptop Magazine, retrieved from the Internet on Dec. 21, 2013, at <http://www.laptopmag.com/review/accessories/Toshiba-dynadock-v.aspx>, pp. 1-2.
International Preliminary Report on Patentability for Application No. PCT/US2014/017434 filed Feb. 20, 2014, and mailed from the International Bureau dated Sep. 17, 2015, 10 pgs.
International Preliminary Report on Patentability for Application No. PCT/US2015/065730 filed Dec. 15, 2015, and mailed from the International Bureau dated Apr. 6, 2016, 13 pgs.
International Preliminary Report on Patentability for PCT/US2012/023717 filed Feb. 3, 2012, and dated Aug. 15, 2013, 6 pgs.
International Search Report and Written Opinion dated May 21, 2018 for PCT/US2018/017232.
International Search Report and Written Opinion dated Oct. 27, 2017 for PCT/US2017/048367.
International Search Report and Written Opinion dated Aug. 30, 2012 for PCT/US2012/023717.
International Search Report and Written Opinion dated Jun. 30, 2014 for PCT/US2014/017434.
International Search Report and Written Opinion for PCT/US2015/065730 filed Dec. 15, 2015, and mailed from the International Searching Authority dated Apr. 6, 2016, 16 pgs.
Non-Final Office Action for U.S. Appl. No. 13/365,754, filed Feb. 3, 2012, and mailed from the USPTO dated May 13, 2014, 18 pgs.
Non-Final Office Action for U.S. Appl. No. 13/365,754, filed Feb. 3, 2012, and mailed from the USPTO dated Sep. 10, 2013, 15 pgs.
Non-Final Office Action for U.S. Appl. No. 13/365,754, filed Feb. 3, 2012, and mailed from the USPTO dated Sep. 17, 2014, 25 pgs.
Non-Final Office Action for U.S. Appl. No. 13/786,038, filed Mar. 5, 2013, and mailed from the USPTO dated Sep. 18, 2014, 24 pgs.
Non-Final Office Action for U.S. Appl. No. 14/634,196, filed Feb. 27, 2015, and mailed from the USPTO dated Sep. 7, 2016, 25 pgs.
Non-Final Office Action for U.S. Appl. No. 14/923,833, filed Oct. 27, 2015, and mailed from the USPTO dated Mar. 2, 2017, 22 pgs.
Non-Final Office Action for U.S. Appl. No. 14/923,833, filed Oct. 27, 2015, and mailed from the USPTO dated Nov. 1, 2016, 14 pgs.
Non-Final Office Action for U.S. Appl. No. 14/970,318, filed Dec. 15, 2015, and mailed from the USPTO dated Feb. 6, 2017, 21 pgs.
Non-Final Office Action for U.S. Appl. No. 14/970,318, filed Dec. 15, 2015, and mailed from the USPTO dated Oct. 14, 2016, 13 pgs.
Non-Final Office Action for U.S. Appl. No. 15/261,204, filed Sep. 9, 2016, and mailed from the USPTO dated Apr. 30, 2018.
Notice of Allowance dated Dec. 6, 2017 for U.S. Appl. No. 14/970,318.
Notice of Allowance dated Dec. 18, 2017 for U.S. Appl. No. 14/923,833.
Notice of Allowance for U.S. Appl. No. 13/365,754, filed Feb. 3, 2012, and mailed from the USPTO dated Feb. 4, 2015, 8 pgs.
U.S. Appl. No. 14/634,196, Non-Final Office Action, dated Sep. 7, 2016, 25 pgs.
U.S. Appl. No. 14/970,318, Non-Final Office Action, dated Jul. 11, 2017, 15 pgs.
U.S. Appl. No. 15/261,204, Advisory Action, dated Feb. 1, 2019, 7 pages.
U.S. Appl. No. 15/261,204, Final Office Action, dated Nov. 2, 2018, 22 pgs.
U.S. Appl. No. 15/905,241, Non-Final Office Action, dated Nov. 2, 2018, 34 pgs.
U.S. Appl. No. 16/029,339, Non-Final Office Action, dated Nov. 2, 2018, 28 pgs.
Ganesh, "Visible Engergy UFO Power Center Smart Power Strip Review", AnandTech, http://www.anandtech.com/show/6413/visible-energy-ufo-power-center-smart-power-stripreview, Oct. 26, 2012.
U.S. Appl. No. 16/029,339, Final Office Action, dated Apr. 19, 2019, 14 pages.
U.S. Appl. No. 15/261,204, Non-Final Office Action, dated Jun. 27, 2019, 20 pages.
U.S. Appl. No. 16/029,339, Non-Final Office Action, dated Aug. 8, 2019, 14 pages.
U.S. Appl. No. 16/029,339, Notice of Allowance, dated Dec. 4, 2019, 10 pages.
U.S. Appl. No. 15/261,204, Notice of Allowance, dated Feb. 4, 2020, 8 pages.

* cited by examiner

Asset Usage Report for Monday 10am

| Asset Name | Asset Tag | Device Type | Device Detected | Confirmed |
|---|---|---|---|---|
| CPU 1 | ZXCV | DILL XSP 3000 | DILL XSP 3000 | X |
| Display 1 | ASDF | DILL VISIONCLEAR 3000 | DILL VISIONCLEAR 3000 | X |
| Printer 1 | QWER | BMI JET 150 | BMI JET 150 | X |
| CPU 2 | SDFG | DILL XSP 3000 | DILL XSP 3000 | X |
| Display 2 | DFGH | DILL VISIONCLEAR 3000 | DILL VISIONCLEAR 3000 | X |
| Printer 2 | ERTY | BMI JET 150 | NONE | |
| CPU 3 | DFGH | DILL XSP 4000 | DILL XSP 3000 | |
| Display 3 | CVBN | DILL VISIONCLEAR 3000 | DILL VISIONCLEAR 3000 | X |
| Printer 3 | VBMM | BMI JET 150 | BMI JET 150 | X |
| CPU 4 | FJHJ | DILL XSP 3000 | PINKPAD 1X Germanium | |
| Display 4 | RTYU | DILL VISIONCLEAR 3000 | NONE | |
| Printer 4 | LKJH | BMI JET 200 | BMI JET 150 | |

FIG. 25

SYSTEMS, METHODS AND DEVICES FOR REMOTE POWER MANAGEMENT AND DISCOVERY

TECHNICAL FIELD

The present disclosure relates to power management and more specifically to remote power management and discovery.

BACKGROUND

A modern office space typically has multiple general purpose power outlets (GPOs) available to supply mains power to all manner of office equipment. Such office equipment may include, for example, computers, monitors, laptop docking stations, printers, scanners, modems, routers, charging stations, and the like. Each desk, office, cubicle, or workstation in an office space is typically associated with a set of one or more GPOs to power a set of devices associated with an individual worker.

A fairly recent trend is the concept of hot-desking, whereby workers are not assigned individual desks or workstations on a permanent or semi-permanent basis. Instead, desks or workstations are allocated on a daily basis, through first-come, first-served or through a booking system.

Such hot-desking implementations can help a business to save on real estate costs and power costs, particularly for those businesses in which it is common for some percentage of the staff to be out of the office on a regular basis. In such circumstances, the business does not need to provide real estate and other facilities based on the maximum number of staff, but rather can provide real estate and other facilities based on the maximum number of staff expected to attend a worksite on any given day.

The amount of electronic office equipment has increased significantly over the years, from a simple desktop computer with a single monitor to a desktop computer with multiple monitors, laptop computers, tablet computing devices, smartphones, and the like. Each of these electronic devices typically requires access to mains power supply for some or all of the working day. As the number of electronic devices has increased, so too have the power costs for businesses. However, the power loads, and resultant costs, are typically not distributed evenly across all workers and worksites.

BRIEF DESCRIPTION OF THE DRAWINGS

FIG. 25 is a diagram illustrating a screenshot of an enhanced asset management system consistent with embodiments disclosed herein.

DETAILED DESCRIPTION

Figure 1:
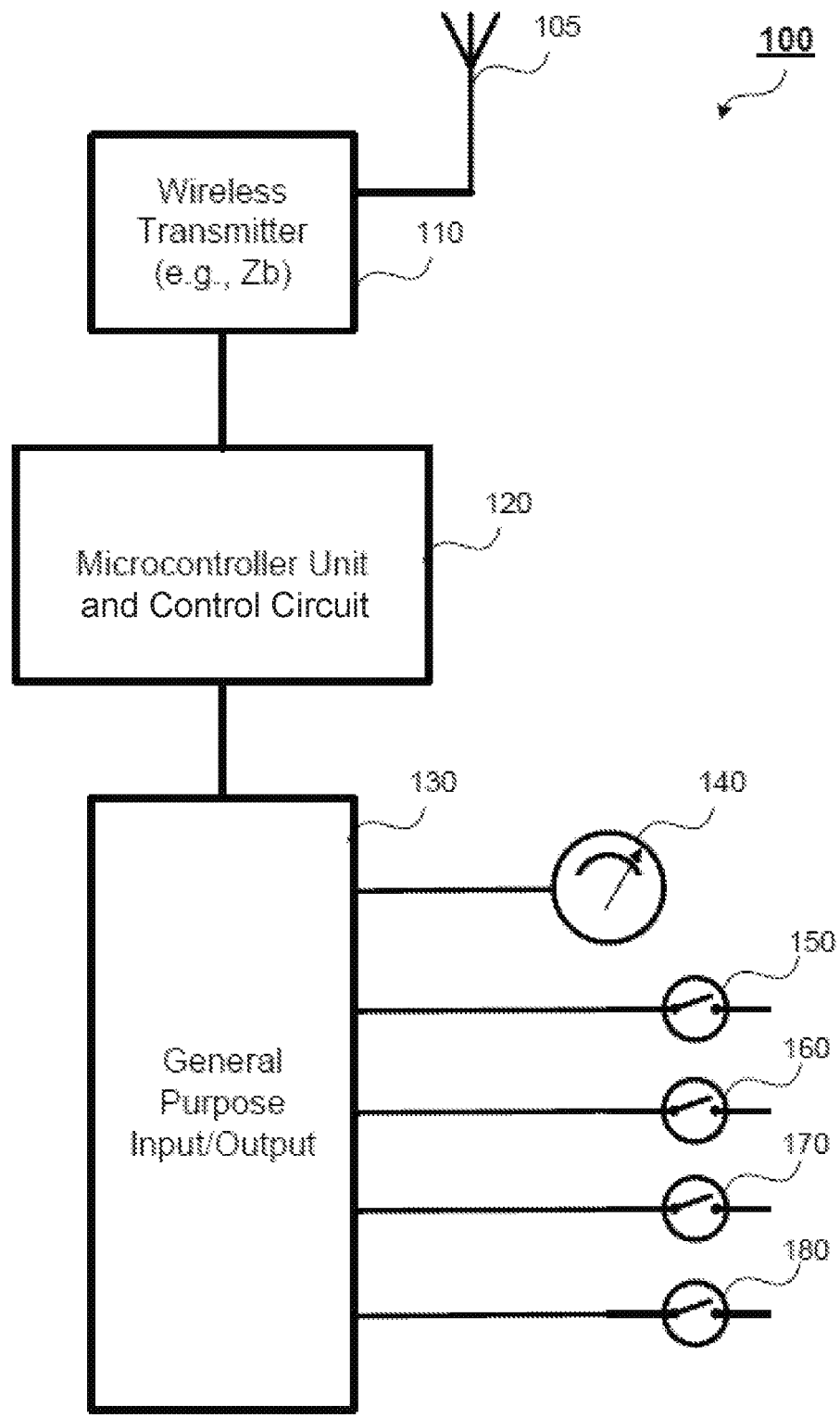
FIG. 1 is a schematic block diagram representation of a power management device consistent with embodiments disclosed herein.

A detailed description of systems and methods consistent with embodiments of the present disclosure is provided below. While several embodiments are described, it should be understood that the disclosure is not limited to any one embodiment, but instead encompasses numerous alternatives, modifications, and equivalents. In addition, while numerous specific details are set forth in the following description in order to provide a thorough understanding of the embodiments disclosed herein, some embodiments can be practiced without some or all of these details. Moreover, for the purpose of clarity, certain technical material that is known in the related art has not been described in detail in order to avoid unnecessarily obscuring the disclosure.

Techniques, apparatus and methods are disclosed that enable real-time remote managing, status reporting and analysis on the health/condition of equipment connected to the power monitoring device (also known as a power management device/system or PMD). This system monitors, manages as well as collects energy consumption data (including power related information, other electrical parameters, metadata for real time and future analysis though hardware devices). It can also perform real time and pre-defined system control based on data collected. It can be in a single location or multiple locations realized through a wired or wireless network. For example, a PMD provides data such as whether the equipment connected is idling, fully operating, malfunctioning etc. The PMD can turn the power on/off, trigger system alert, and perform time-delayed or special profile programming to manage and monitor equipment usage.

Techniques, apparatus and methods are disclosed that enable energy consumption signature identification capability which can identify what equipment, such as monitor, laptop, lighting equipment, etc., are being connected. For example, the PMD can even identify OEM brands if given a large enough database of energy consumption signatures. Using a signature mapping process, the PMD can also identify unknown/non-workspace-intended equipment being connected, such as a microwave, refrigerator, toaster, etc. In some embodiments, the power management device samples a power draw and provides the waveform to a central service for identification. The central service can provide a configuration and/or commands to the power management device based at least in part on the waveform information (e.g., device model, activity status, etc.).

Techniques, apparatus and methods are disclosed that enable real-time diagnosis and collection of power consumption, other electrical data, metadata and usage pattern for power needs, equipment infrastructure, workspace planning, etc. For example, a large enough database can be very helpful for the infrastructure planning of company or government entities.

Techniques, apparatus and methods are disclosed that enable asset management by discovering which models of devices are active and connected to a predetermined power management device. If the detected model matches an expected model, the asset tag can be confirmed. By confirming detected models, asset management can move from an inventory process to a missing-item search or mismatched-item search.

Techniques, apparatus and methods are disclosed that enable temperature sensing of a power management device and/or devices that are active. For example, temperature sensing can be embedded in the power strip/power management device or general purpose power outlets (GPOs). Temperature sensing can be accomplished through a thermal couple or a thermistor/sensor which tracks the actual temperature of the power management device in case of localize heating due to a malfunctioning or over loading of devices.

Metadata collected can include measured energy consumption characteristics and energy consumption data. Measured energy consumption characteristics can include instantaneous voltage, average voltage, instantaneous amperage, instantaneous wattage, average wattage, etc. Energy consumption data can include power profile, current profile, electronics signature, electronic waveform, device temperature, etc. The system can remotely managing power usage, meta data collections, power profiles recognition as well as system protection due to over power, over current, over voltage, over temperature.

In some embodiments, a method and system for measuring energy consumption relating to one or more general purpose power outlets (GPOs) can be used, based on readings derived from a power management device. The measured energy consumption may then be utilised to evaluate workspace utilisation based on the location of one or more of the GPOs. The power management device receives a mains power supply, which is coupled by the device to a set of one or more power outlets. The power management device includes a power meter and a microcontroller for controlling at least one relay, wherein the relay is coupled to at least one of the power outlets.

Figure 3:
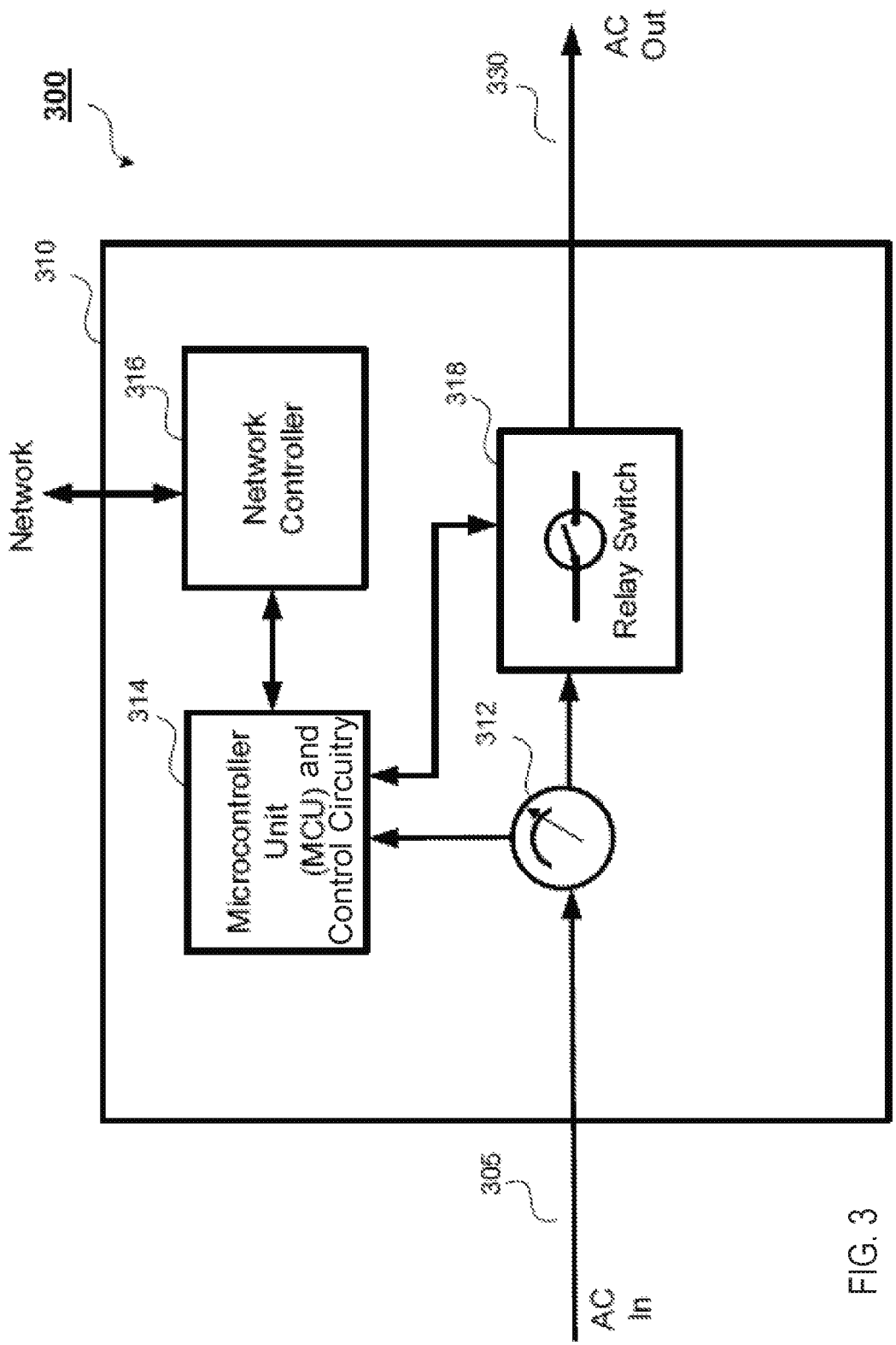
FIG. 3 is a schematic block diagram representation of a power management device with a network controller consistent with embodiments disclosed herein.

FIG. 3 is a schematic block diagram representation of a power management device 300 with a network controller 316. The power management device includes a housing 310 that includes the network controller 316, which is adapted to be coupled to an external communications network. The communications network may be implemented using one or more wired or wireless connections, including a Local Area Network (LAN), Wide Area Network (WAN), a virtual private network (VPN), cellular telephony network, the Internet, or any combination thereof The network controller 316 is coupled to a microcontroller 314, which receives power and thermal information from a multi-purpose electrical meter/sensors network 312. These data include instantaneous and average voltage, amperage, wattage as well as power profile, current profile, electronics signatures/waveforms, device temperature, other meta data etc. The meter 312/sensors network is coupled to an input mains power supply 305 and a relay switch 318. The relay switch 318 is operated by the microcontroller 314, in response to commands received over the network via the network controller 316. The relay switch 318 is coupled to an external power outlet 330, represented in the drawing as alternating current (AC) out.

FIG. 1 is a schematic block diagram representation of a power management device 100 adapted to communicate wirelessly with a remote server (not shown). The power management device 100 includes a wireless transceiver 110 (which can include a transmitter), which in this example is configured to operate using the ZigBee (IEEE 802.15.4) wireless communications protocol. The wireless transceiver 110 is coupled to an antenna 105, which may be located internally or externally with respect to a housing of the device 100.

The wireless transceiver 110 is also coupled to a microcontroller 120, which is programmed to control operation of a general purpose input/output (I/O) module 130. The microcontroller 120 may be implemented, for example, using the Maxim Integrated MAX71020 Single-Chip Electricity Meter AFE, Texas Instruments MSP430F6736, or Analog Devices ADE7116 Single Phase Energy Measurement IC. It will be appreciated that other microcontrollers may equally be utilised to control operation of the I/O module 130.

In the example of FIG. 1, the I/O module 130 controls a set of relay switches 150, 160, 170, 180, each of which is coupled to a power outlet (not shown). The I/O module 130 is coupled to a multi-purpose meter 140 that is adapted to monitor power consumed and other electrical data by the power outlets coupled to the relay switches 150, 160, 170, 180.

In operation, the microcontroller 120 is able to be controlled via control signals transmitted from the remote server to the device 100 via the antenna 105 and wireless transceiver 110, so as to instruct the microcontroller 120 to control the I/O module 130 to turn on or off one or more of the relay switches 150, 160, 170, 180. Further, readings from the multi-purpose meter/sensors network 140 are transmitted to the I/O module 130, which in turn forwards the meter readings to the microcontroller 120 for transmission via the wireless transceiver 110 and the antenna 105 to the remote server.

In one arrangement, the microcontroller 120 and wireless transceiver 110 are implemented as an integrated unit. For example, the microcontroller 120 and wireless transceiver 110 may be implemented using a single system on a chip (SoC) device, such as the ATMEL SAM21-Cortex-M0+ SOC with Zigbee wireless transceiver or the Texas Instruments CC2538-Cortex-M3 SOC with Zigbee wireless transceiver.

In one scenario, the remote server receives power meter readings over a period of time. When the multi-purpose meter/sensors network readings drop below a predefined threshold, it may be assumed that no electrical devices connected to the relay switches 150, 160, 170, 180 are in use and thus the remote server can instruct the microcontroller 120 to shut down one or more of the power outlets connected to the relay switches 150, 160, 170, 180 to reduce standby loads or "vampire" loads.

Figure 2:
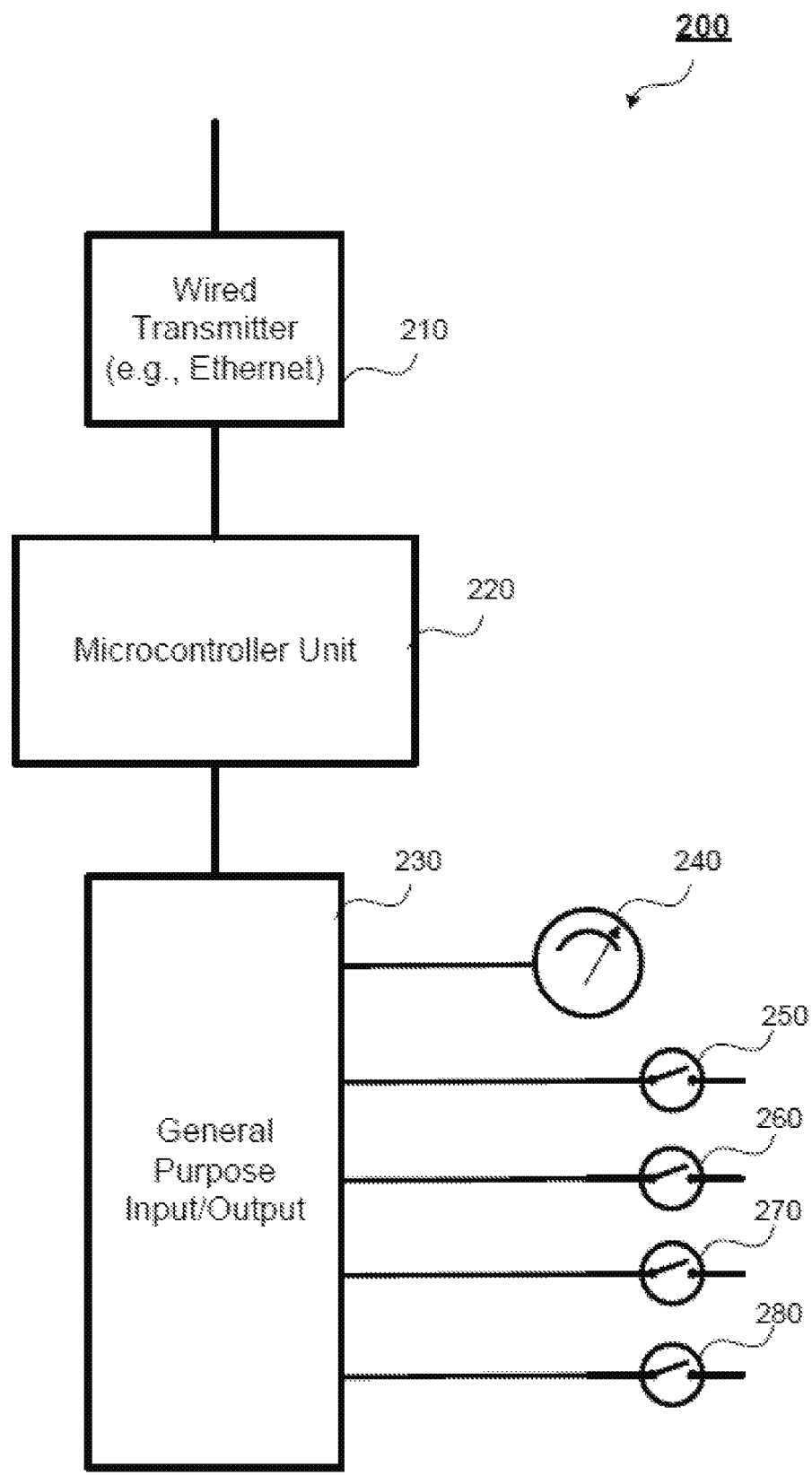
FIG. 2 is a schematic block diagram representation of a power management device consistent with embodiments disclosed herein.

FIG. 2 is a schematic block diagram representation of a power management device 200 adapted to communicate wirelessly with a remote server (not shown). The power management device 200 includes a wired transmitter 210, which in this example is an Ethernet connection adapted to be coupled to a communications network.

The transmitter 210 is also coupled to a microcontroller 220, which is programmed to control operation of a general purpose I/O module 230. The I/O module 230 controls a set of relay switches 250, 260, 270, 280, each of which is coupled to a power outlet (not shown). The I/O module 230 is coupled to a power meter 240 that is adapted to monitor power consumed and other electrical data by the power outlets coupled to each of the relay switches 250, 260, 270, 280.

In one arrangement, the microcontroller 220 and transmitter 210 are implemented as an integrated unit. For example, the microcontroller 220 and transmitter 210 may be implemented using a single system on a chip (SoC) device, such as the Texas Instruments Stellaris Cortex-M3 SOC with 10/100 Ethernet MAC with PHY or the ATMEL SAM7X ARM7 SOC with 10/100 Ethernet MAC with PHY.

In operation, the microcontroller 220 is able to be controlled via control signals transmitted from the remote server to the device 200 via the transmitter 210, so as to instruct the microcontroller 220 to control the I/O module 230 to turn on or off one or more of the relay switches 250, 260, 270, 280. Further, readings from the power meter 240 are transmitted to the I/O module 230, which in turn forwards the meter readings to the microcontroller 220 for transmission via the Ethernet transmitter 210 to the remote server.

In one scenario, the remote server receives data readings over a period of time. When the power meter readings drop below a predefined threshold, it may be assumed that no electrical devices connected to the relay switches 250, 260, 270, 280 are in use and thus the remote server can instruct the microcontroller 220 to shut down one or more of the power outlets connected to the relay switches 250, 260, 270, 280 to reduce standby loads or "vampire" loads.

While a power strip form factor is often referred to in this disclosure for the sake of clarity, it should be recognized that other form factors are contemplated, including flexible cable networks, in-wall plugs, power cubes, extension cords, etc. The embodiments disclosed should not be limited to the form factor recited, but should be read to include other form factors unless specifically disclaimed.

Figure 10:
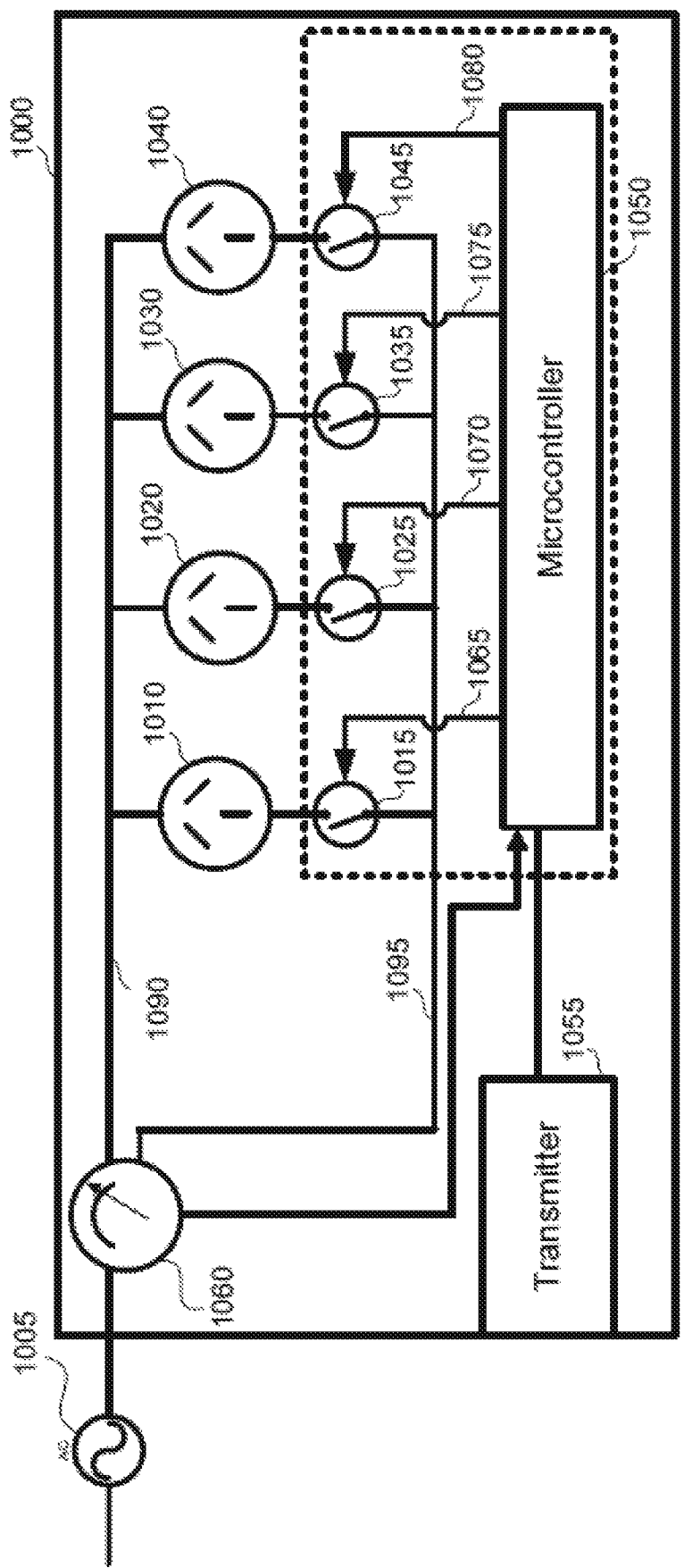
FIG. 10 is a schematic block diagram representation of a power management device embodied in a power board consistent with embodiments disclosed herein.

FIG. 10 is a schematic block diagram representation of a power management device embodied in a four outlet power board 1000. The power board 1000, also known as a power strip, receives an AC mains supply 1005, which is fed to a multi-purpose meter/sensors network 1060. A top power rail 1090 feeds each of a first power outlet 1010, a second power outlet 1020, a third power outlet 1030, and a fourth power outlet 1040, all of which are connected in parallel.

The output of the first power outlet 1010 is connected to a first relay 1015, which is coupled to a bottom power rail 1095 that returns to the power meter 1060 in order to complete the circuit. The output of the second power outlet 1020 is connected to a second relay 1025. The output of the third power outlet 1030 is connected to a third relay 1035. The output of the fourth power outlet 1040 is connected to a fourth relay 1045. The outputs of the second, third, and fourth relays 1025, 1035, and 1045 are all coupled to the bottom power rail 1095.

The power board 1000 further includes a transmitter 1055, which is adapted to couple the power board 1000 to an external communications network. The transmitter 1055 may be implemented using wired or wireless technologies, including, but not limited to, Ethernet, Universal Serial Bus (USB), Wi-Fi, Bluetooth, ZigBee, SigFox, LoRa, 6LoWPAN, and the like.

The power board 1000 also includes a microcontroller 1050, which is coupled to the transmitter 1055. Where the transmitter 1055 is implemented as a transceiver, an external user can send control signals via the external communications network to the transmitter 1055 and then to the microcontroller 1050. The microcontroller 1050 is also coupled to each of the relays 1015, 1025, 1035, and 1045, via respective control lines 1065, 1070, 1075, 1080 which enable the microcontroller 1050 to control the application of power to each of the respective power outlets 1010, 1020, 1030, 1040.

In an alternative embodiment (not shown), a single relay controls the application of power to each of the set of power outlets 1010, 1020, 1030, 1040. In such an arrangement, all of the power outlets 1010, 1020, 1030, 1040 are controlled together, such that the power outlets 1010, 1020, 1030, 1040 are all turned on or all turned off. In the arrangement shown in FIG. 10, the microcontroller 1050 is able to control power to the power outlets 1010, 1020, 1030, 1040 independently.

The multi-purpose meter/sensor network 1060 records the aggregate power consumption across all of the power outlets 1010, 1020, 1030, 1040 and transmits recorded power information to the microcontroller 1050. The microcontroller 1050 sends some or all of the recorded power information to the transmitter 1055 for transmission to a remote server.

Figure 11:
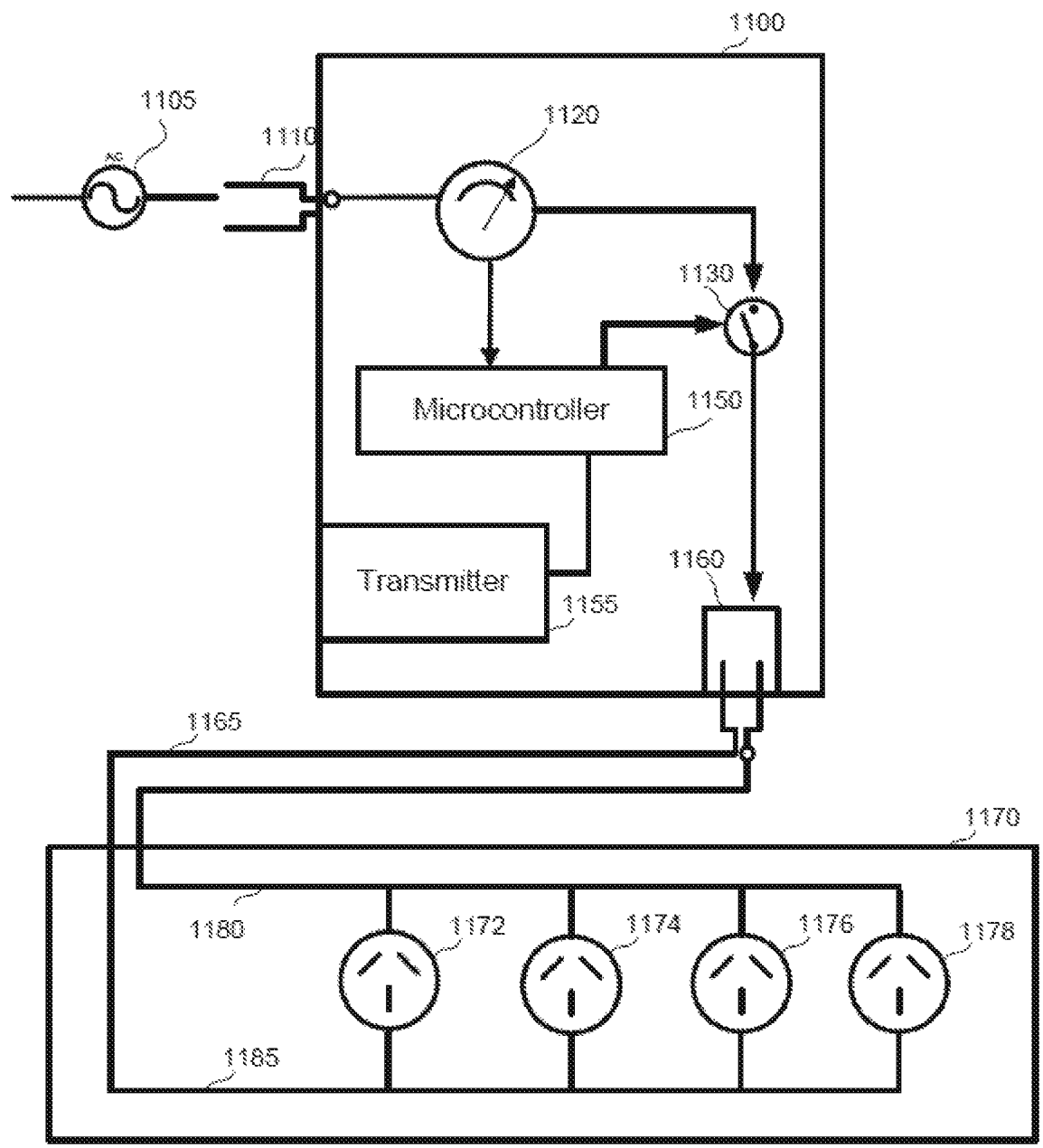
FIG. 11 is a schematic block diagram representation of a standalone power management device adapted to be coupled to existing electronic devices consistent with embodiments disclosed herein.

FIG. 11 is a schematic block diagram representation of a standalone power management device 1100 adapted to be coupled to existing electronic devices. In the example of FIG. 11, the power management device 1100 is coupled to a power board 1170. However, it will be appreciated that the standalone management device 1100 may be coupled to any electronic device, including, but not limited to, a computer, monitor, lamp, fan, and the like.

The power management device 1100 includes an input connector 1110 for coupling to a mains power supply 1105. The input connector 1110 may be implemented, for example, using a standard power plug adapted to plug into a standard power outlet for the particular jurisdiction in which the device 1110 is to operate. The input connector 1110 may be connected directly to a housing of the power management device 1100 or, alternatively, may include a section of power cable to facilitate ease of coupling of the device 1100 to a power outlet. The mains power is passed through the connector 1110 to a power meter 1120 and then to an output connector 1160, via a relay 1130. A microcontroller 1150 is adapted to turn the relay 1130 on and off to control flow of electricity from the input connector 1110 to the output connector 1160. The output connector 1160 may be implemented, for example, as a general purpose outlet adapted to receive a standard electrical plug rated for the particular jurisdiction in which the device 1100 is to operate. In one arrangement, the output connector 1160 is implemented using an AS/NZ61535.1 compliant connector from CMS Electracom, as such connectors are commonly used in office fitouts.

The power meter 1120 is connected to the microcontroller 1150 and provides power information to the microcontroller 1150 over time. The microcontroller 1150 is also connected to the relay 1130, so as to control coupling of the input mains power supply from the input connector 1110 to the external connector 1160. The microcontroller 1150 is further connected to a transmitter 1155. As described above with reference to the transmitter 1055 of FIG. 10, the transmitter 1155 may be a wired or wireless transmitter implemented, for example, using Ethernet, Universal Serial Bus (USB), Wi-Fi, Bluetooth, ZigBee, SigFox, LoRa, 6LoWPAN, or any other appropriate transmission protocol. The transmitter 1155 is adapted to transmit power information received by the microcontroller 1150 from the power meter 1120 to a remote server (not shown).

In the example of FIG. 11, the power management device is coupled to a power board 1170, which includes a set of four power outlets 1172, 1174, 1176, 1178. The power board 1170 is connected to the output connector 1160 by a power cord 1165, wherein a first conductor in the power cord 1165 is an active conductor connected to an upper power rail 1180 of the power board 1170 and a second conductor in the power cord 1165 is a neutral conductor connected to a lower power rail 1185 in the power board 1170.

In operation, the standalone power management device 1110 may be plugged into an existing power outlet using the input connector 1110 and an electronic device may be coupled to the output connector 1160. The power meter 1120 is then able to monitor power consumption and other electrical data of the device connected to the output connector 1160, whereupon the microcontroller 1150 controls transmission of the power information via the transmitter 1155 to a remote server. In the example of FIG. 11, the power meter 1120 monitors the aggregate power consumption of all devices connected to the power outlets 1172, 1174, 1176, 1178. Further, when the transmitter 1155 is implemented as a transceiver, the remote server can send instructions to the microcontroller 1150, via the transmitter 1155, to turn power on or off by operating the relay 1130.

The management device 1100 may be optionally equipped with a display device, such as an LED panel, for displaying power data derived from the multi-purpose meter/network sensors 1120. Such power data may include, for example, instantaneous power readings, average power readings, maximum power readings, minimum power readings, instantaneous voltage readings, average voltage readings, instantaneous current readings, average current readings, temperature over a predefined time period, maximum readings, minimum readings, and the like. In one arrangement, the display device is associated with a user interface that enables a user to scroll through one or more power readings. The user interface may be implemented, for example, using buttons, a touch screen, or the like.

Figure 4:
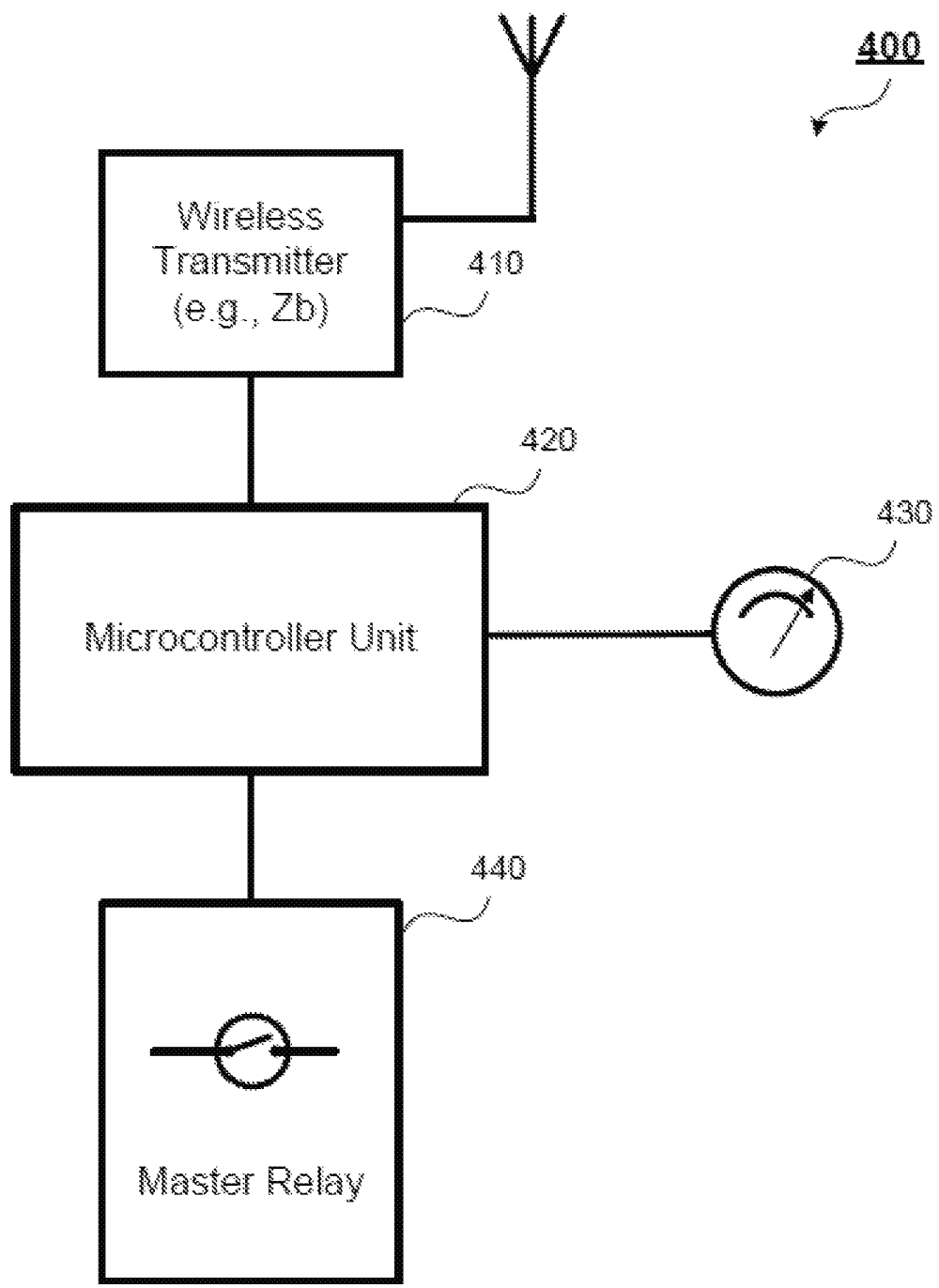
FIG. 4 is a schematic block diagram representation of a power management device adapted to be used with existing power outlets consistent with embodiments disclosed herein.

FIG. 4 is a schematic block diagram representation of a standalone power management device 400 adapted to be used with existing power outlets and featuring a wireless transceiver 410 implemented using the ZigBee communications protocol. The wireless transceiver 410 is coupled to a microcontroller 420, which controls operation of a master relay 440. As described above with reference to the embodiment of FIG. 11, the relay 440 controls delivery of power from a mains power supply to which the management device is connected to a connected device. The microcontroller 420 is also coupled to a power meter 430, which monitors the power consumed by the connected device and feeds power information back to the microcontroller 420 for storage and/or transmission by the transceiver 410.

Figure 5:
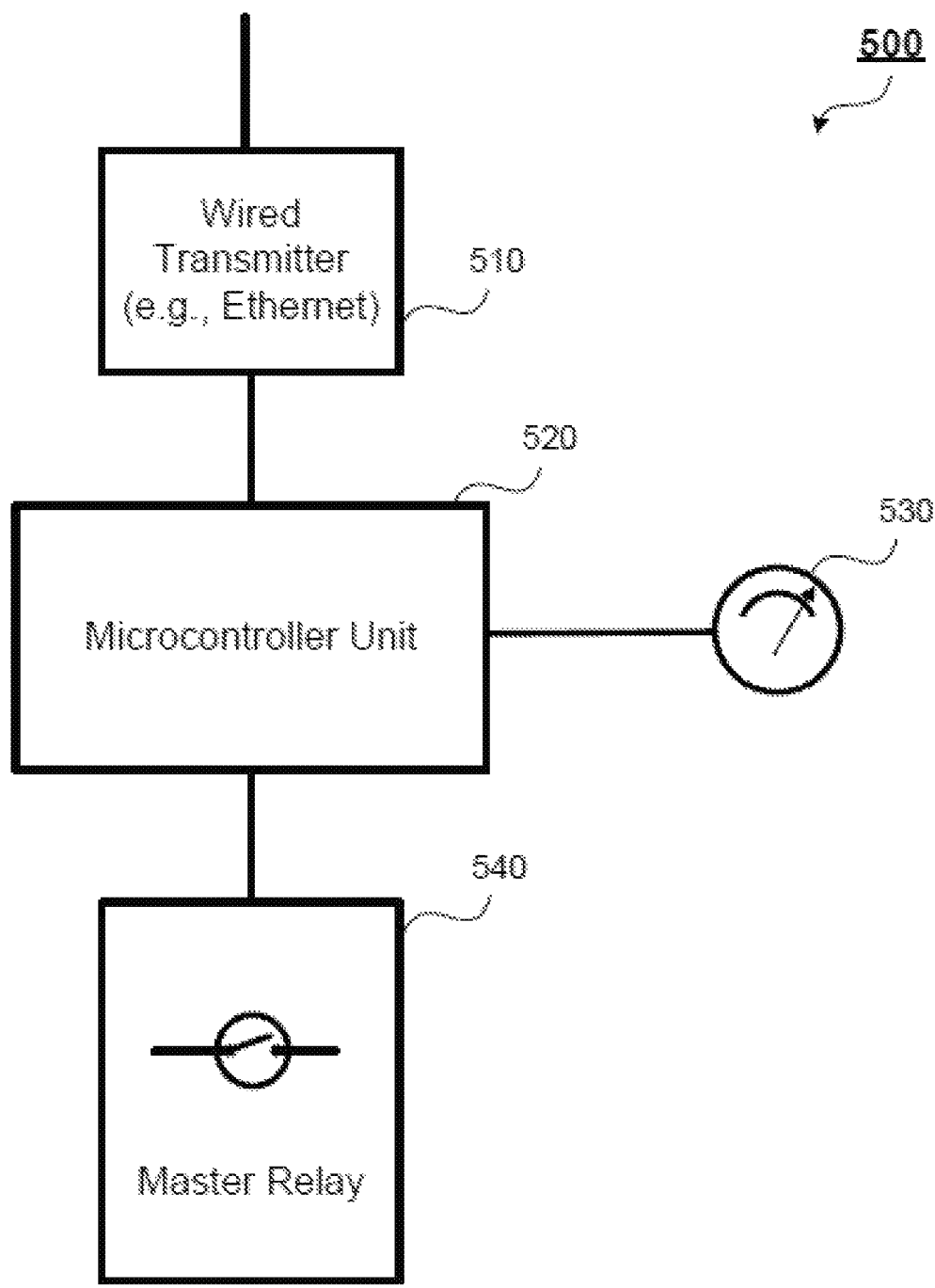
FIG. 5 is a schematic block diagram representation of a power management device adapted to be used with existing power outlets consistent with embodiments disclosed herein.

FIG. 5 is a schematic block diagram representation of a power management device 500 adapted to be used with existing power outlets and featuring a wired transceiver 510 implemented using the ZigBee communications protocol. The wireless transceiver 510 is coupled to a microcontroller 520, which controls operation of a master relay 540. As described above with reference to the embodiment of FIG. 11, the relay 540 controls delivery of power from a mains power supply to which the management device is connected to a connected device. The microcontroller 520 is also coupled to a power meter 530, which monitors the power consumed and other electrical data by the connected device and feeds power information back to the microcontroller 520 for storage and/or transmission by the transceiver 510.

In one arrangement, a method and system utilise one or more of the above mentioned power management devices to collect energy consumption information and power profile from power outlets installed on a set of desks in an activity based working environment. When active work takes place, energy consumption also takes place, due to every device that is plugged into an electrical system exhibiting a certain energy signature or power profile. This information is measured through time and relayed back to a central data server for storage.

The transmission of data from the power management devices may use any communications network, including one or more wired or wireless connections, including a Local Area Network (LAN), Wide Area Network (WAN), a virtual private network (VPN), cellular telephony network, the Internet, or any combination thereof. As described above with reference to FIG. 1, the power management device 100 uses a low power wireless transceiver 110 employing the ZigBee protocol. In other embodiments, the transceiver 110 may be implemented using any suitable wireless transmission protocol, including, but not limited to, 3G, 4G, Wi-Fi, Bluetooth, LTE, or Low-Power Wide-Area Network (LP-WAN) technologies, such as LTE-MTC, LoRa, NarrowBand IoT, or Sigfox. Over time, the data collected is used to establish a trend on workspace utilisation by overlaying energy consumption on a floorplan of activity based workspace. This information indicates hotspots, such as whether areas could be well utilised, over utilised or under utilised. The activity based working environment may then be modified for more efficient use of the workspace.

Methods and systems of the present disclosure may be used to perform, but are not limited to, the following functions: (1) Track workspace utilisation through time; (2) Track and manage energy consumption through time; (2a) This concept allows power to be turned off remotely and automatically allowing the possibility to achieve a 0 W idle; (2b) Allow precise control of what devices to turn on or off; and (3) Track overall health and operation of a work desk remotely. (4) Track and identify devices connected through power profile/electronics signature recognition. (5) Monitor safety status and security risk.

Figure 6:
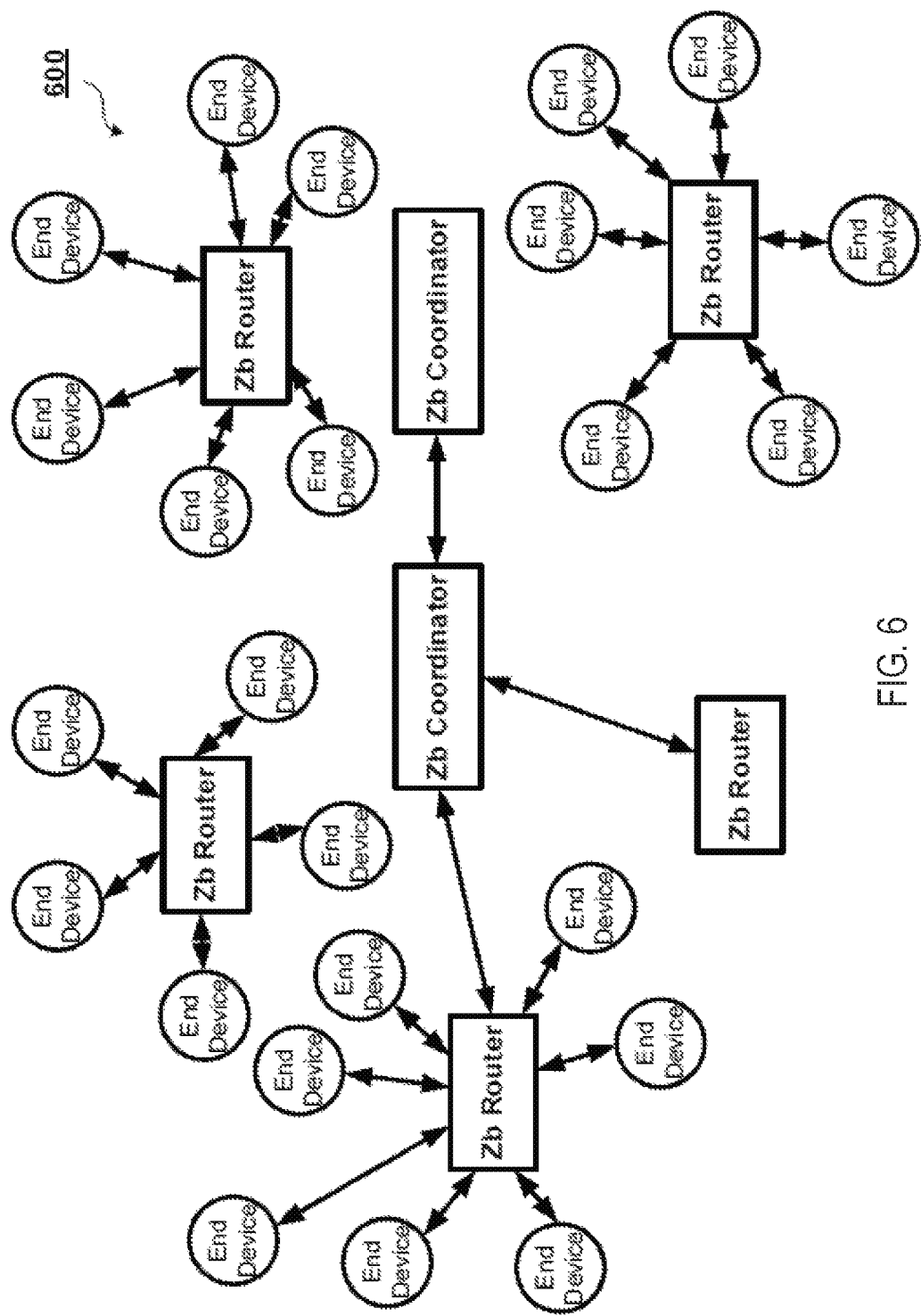
FIG. 6 is a schematic block diagram representation of a network of power management devices consistent with embodiments disclosed herein.

FIG. 6 is a schematic block diagram representation of a network 600 of power management devices. In the example of FIG. 6, the network 600 uses power management devices employing the ZigBee wireless technology, wherein the power management devices are configured in a cluster tree configuration. Each end device is configured in a reduced functionality mode for reduced power consumption, operations simplicity, and cost effectiveness. The end devices may be implemented, for example, using one or more of the power board 1000 of FIG. 10 and/or the power management device 1100 of FIG. 11. The end devices communicate to a ZigBee router. Every ZigBee router is in turn managed by a ZigBee coordinator, which in turn is connected back to a central server. This configuration allows efficient deployment and expansion as more end devices are required, without impacting data traffic and capacity.

In one arrangement, a single ZigBee router is dimensioned to control up to 100 power management devices implemented using ZigBee transceivers at any time and a single ZigBee coordinator is able to control up to 5 ZigBee routers. Such an arrangement allows a capacity of 500 power management devices (i.e., sensors) that can be installed on 500 desks per floor. In a multi floor configuration, the network may be expanded by adding a ZigBee coordinator at every floor and follow up router and then end device, in a manner consistent with that illustrated in FIG. 6.

Figure 7:
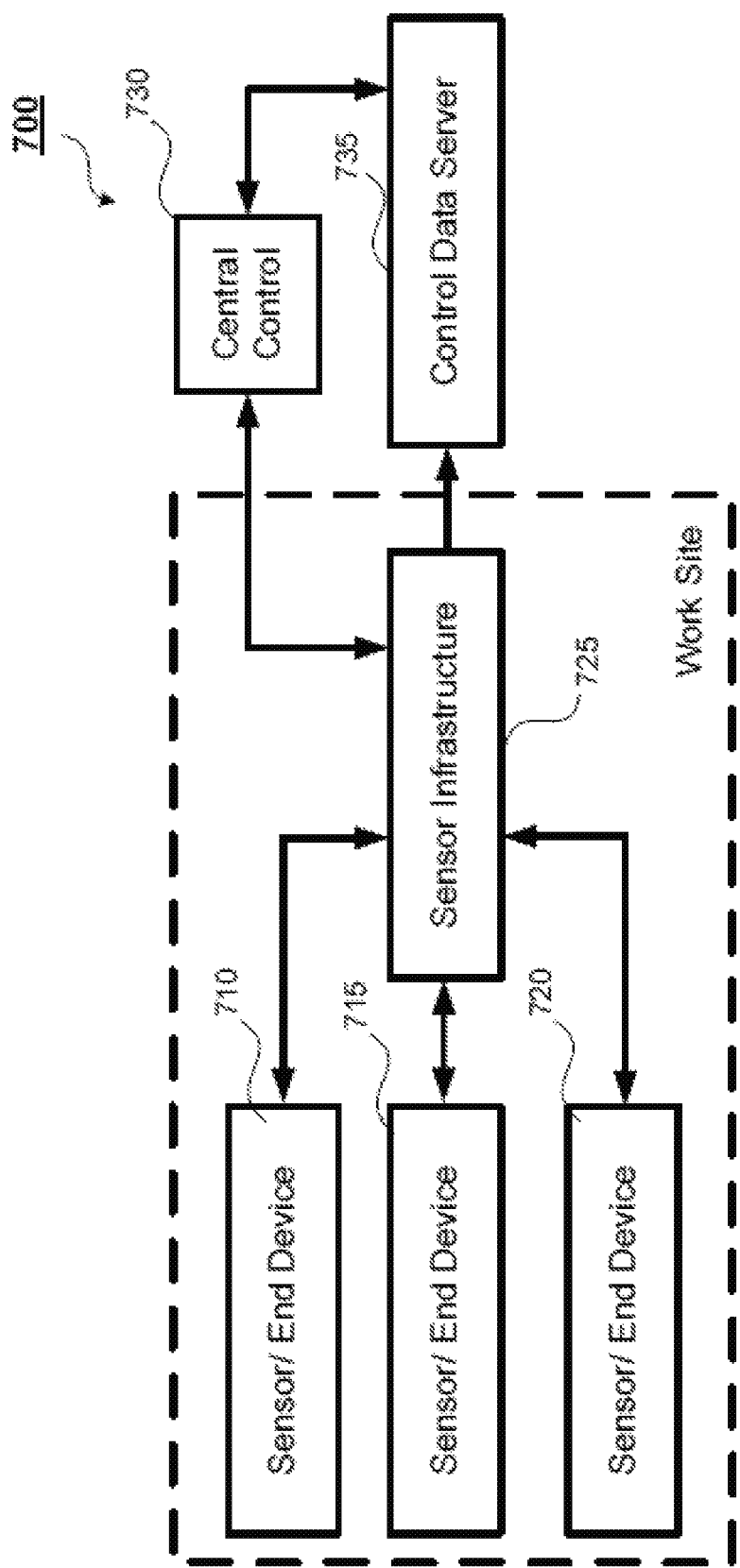
FIG. 7 is a schematic block diagram representation of a system for management of a set of power management devices consistent with embodiments disclosed herein.

FIG. 7 is a schematic block diagram representation of a system 700 for monitoring a set of power management devices. The system 700 includes a set of end devices 710, 715, 720, wherein each end device includes a power management device, such as those described above with reference to FIGS. 10 and 11. Each end device 710, 715, 720 communicates with sensor infrastructure 725, wherein the sensor infrastructure 725 represents the topology of connections among Zigbee coordinators and Zigbee routers for a particular implementation.

The system 700 also includes a central data server 735, which is coupled to a central control unit 730. The central control unit 730 is coupled to the sensor infrastructure 725. The central data server 735 is the remote server referred to in relation to FIG. 10 and FIG. 11 and acts as a central repository for all the energy consumption information, other electrical data, and/or metadata that is transmitted back to base from the end devices 710, 715, 720. The information is stored in a database format consisting of time, energy consumption, other electrical data, metadata location and end device health.

In one arrangement, the central data server 735 has multiple network interfaces by which to couple to a set of ZigBee coordinators. In one particular implementation, each floor of a multi-floor workspace occupies one interface.

The central control unit 730 acts as a controller interface. The central control unit 730 displays all power information in real time, such as device operation and health. Any actions to be performed, such as remotely operating a single end device, are initiated from the central control unit 730. The central control unit 730 is adapted to transmit control commands via the sensor infrastructure 725 for execution by the respective microcontrollers in the end devices 710, 715, 720. The central control unit 730 is able to communicate with the respective microcontrollers to operate the relays and thus control delivery of power through the end devices 710, 715, 720. The central control unit 730 is also able to communicate with the central data server 735 for pulling out data history and trends.

In one arrangement, the central control unit 730 has an associated user interface by which one or more users are able to control aspects of the system 700. In one implementation, the user interface is adapted to be displayed as a dashboard on a display of a computing device.

Figure 8:
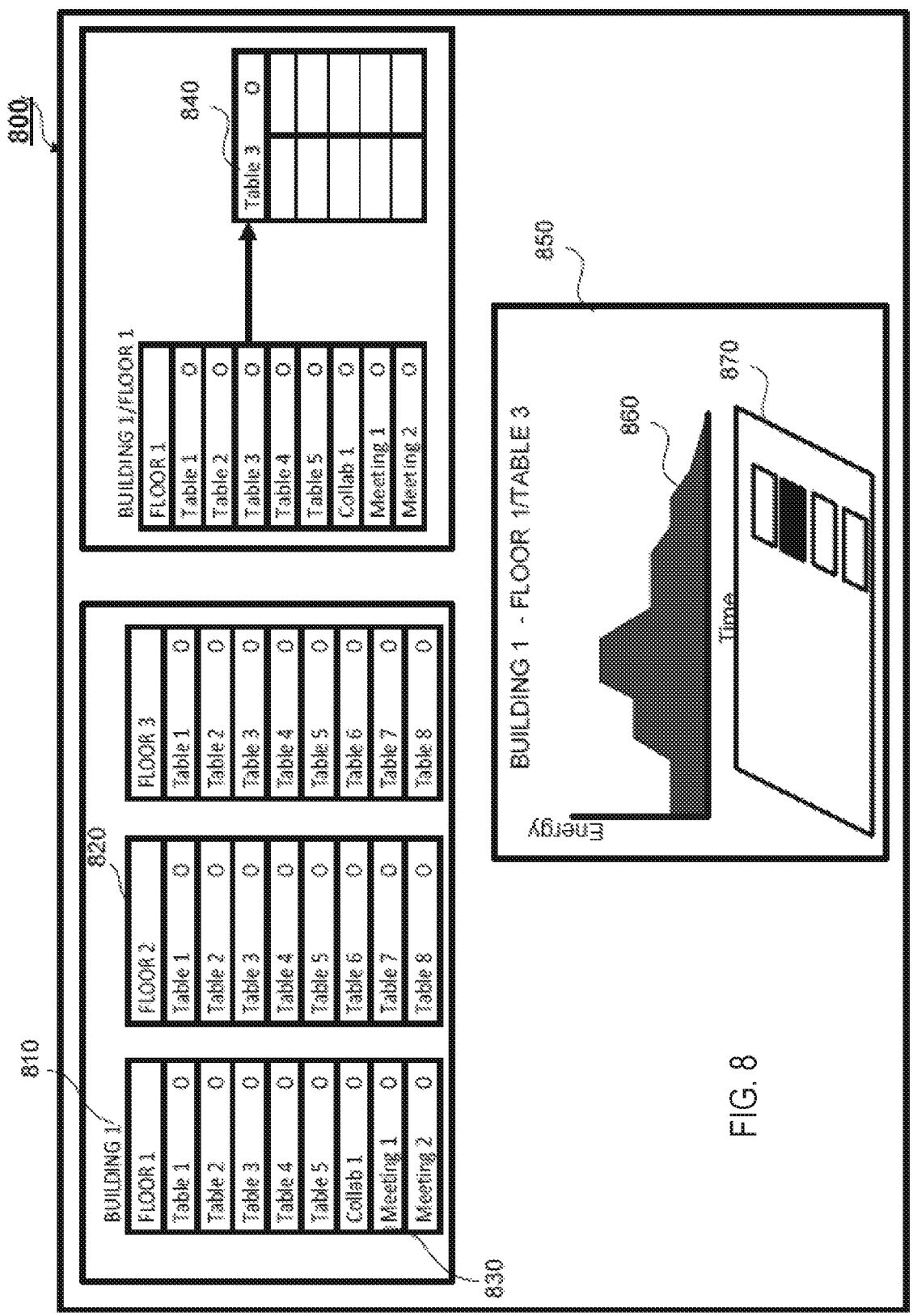
FIG. 8 illustrates a user interface for monitoring and controlling the system of FIG. 7 consistent with embodiments disclosed herein.

FIG. 8 illustrates a user interface 800 having a dashboard for monitoring and controlling the system of FIG. 7. The dashboard 800 aggregates and displays the power information and other electrical data, and/or metadata collected from the various sensors in the system 700. Depending on the size of the workspace in which the power management devices are deployed, the dashboard 800 optionally presents power information by building, by floor, and by table. Each table or a section represents an end device deployed within the work site. The section displays health and/or energy consumption information as a quick summary. Clicking on the section shows more detailed operational information and a set of controls that are available for that sensor. The user interface also shows an energy consumption heat map overlaid on a floor plan to show which area is under-utilised or over-utilised.

In the example of FIG. 8, the dashboard 800 provides information relating to a particular work site. In this instance, a first region 810 indicates a building name or reference, which in this example is "BUILDING 1". The first region displays a set of sensor locations 830, which in this example are arranged by desk or room.

A secondary region 840 provides further information for a selected sensor location. In the example of FIG. 8, Table 3 is the selected sensor location, and the second region 840 provides a table listing a set of sensors associated with Table 3 and their respective power consumption readings.

A third region 850 provides one or more graphical displays relating to power consumption regions associated with a selected area. In the example of FIG. 8, the third region 850 displays information pertaining to the selected sensor location, Table 3. A first graph 860 maps energy consumption, other electrical data, and/or metadata over time for Table 3. A second graph 870 provides a graphical representation of a floorplan to identify a position of Table 3 in its local environment, which in this example is FLOOR 1 of BUILDING 1.

Figure 14:
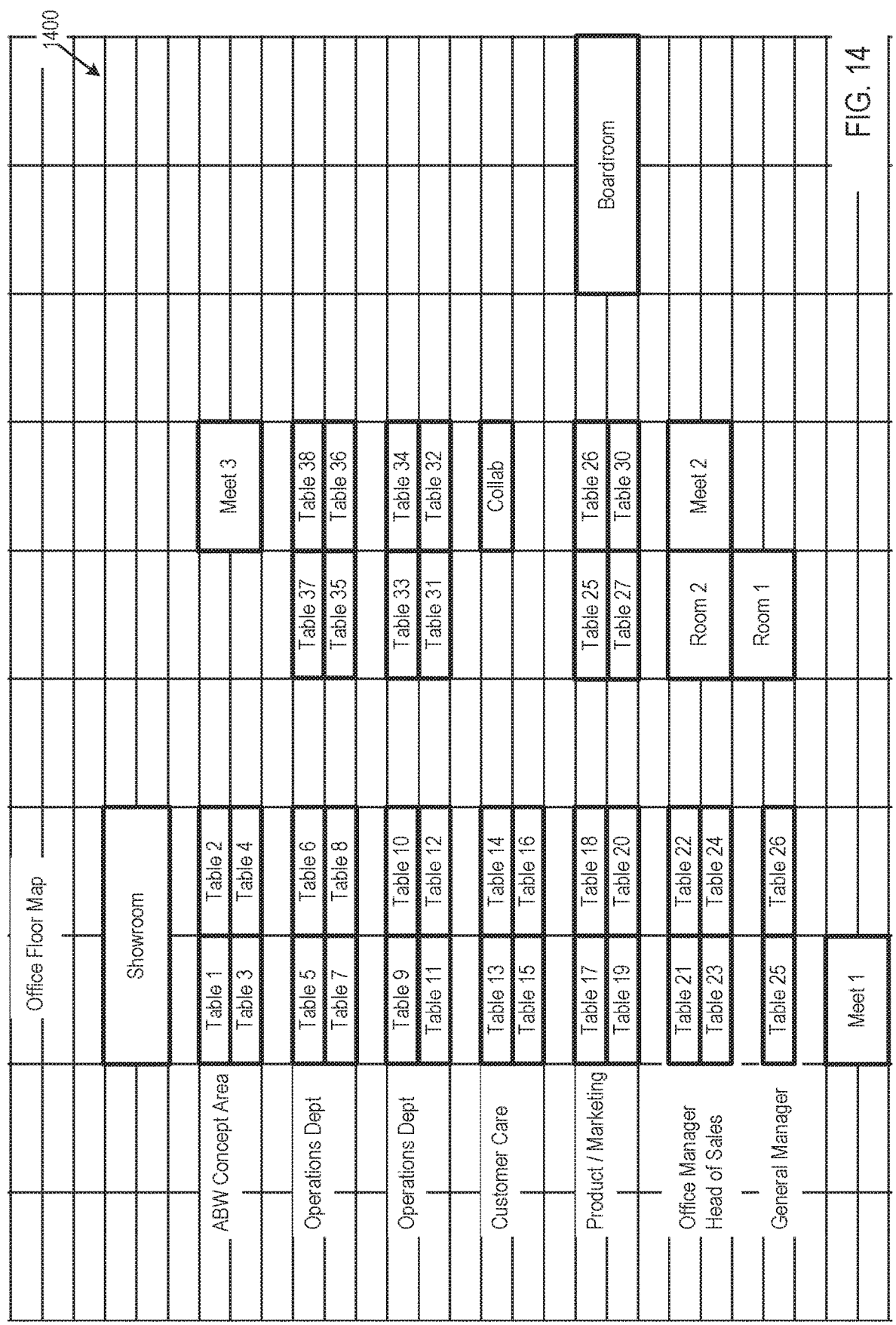
FIG. 14 illustrates a floorplan for an office building, showing sensor locations consistent with embodiments disclosed herein.

FIGS. 14 to 17 illustrate an example in which the central data server 735 generates an energy consumption heat map for a floor of an office building. FIG. 14 illustrates a simplified floorplan 1400 of an office floor having a show-room, a boardroom, three meeting rooms, two other rooms, and 38 desks arranged across two columns.

Figure 15:
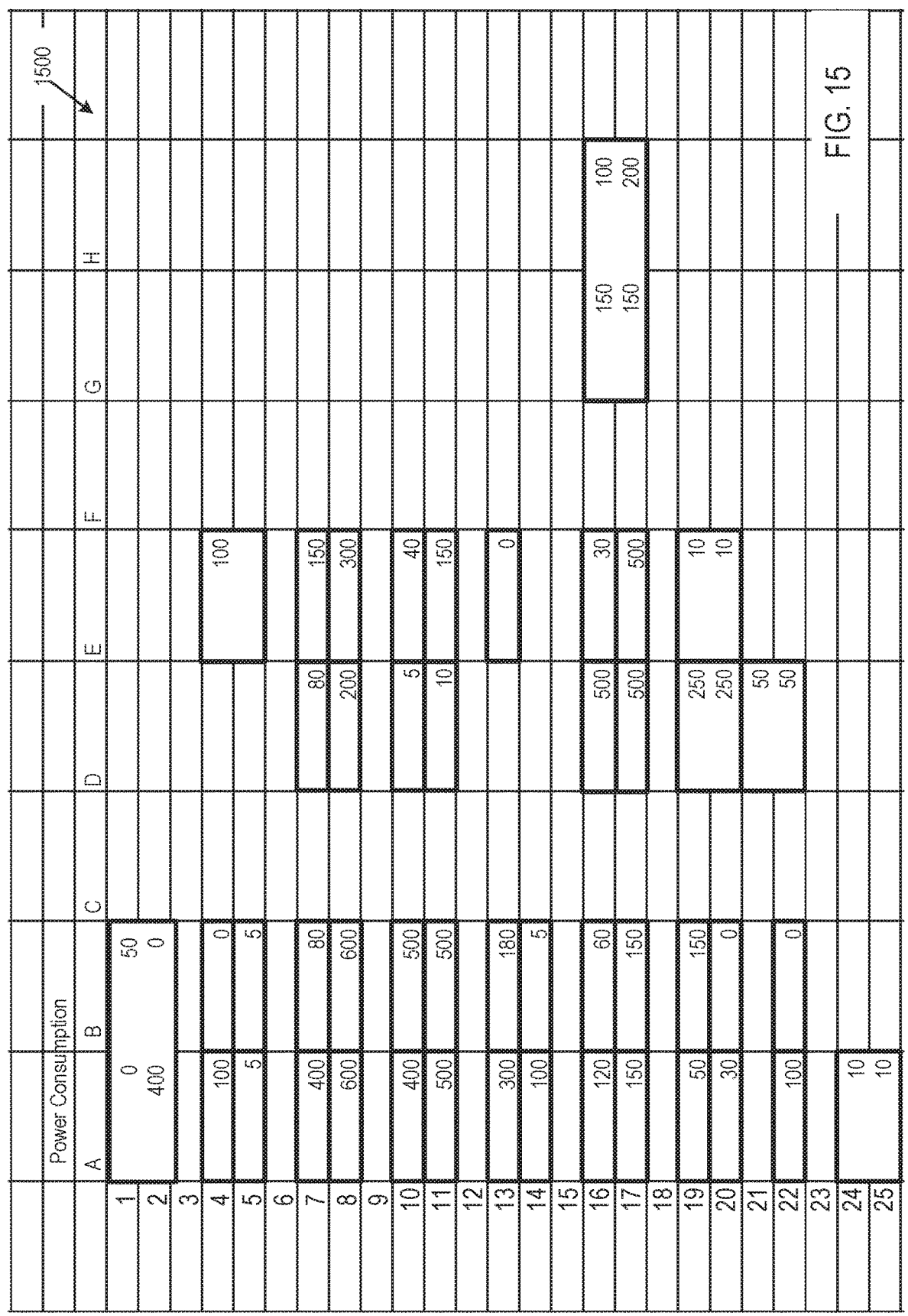
FIG. 15 illustrates the floorplan of FIG. 14, overlaid with a reference grid consistent with embodiments disclosed herein.

To assist in identifying the relative locations of the different desks and rooms, FIG. 15 illustrates a grid overlaid on the floorplan 1400. In this example, a first, horizontal axis is labelled in units A-H and a second, vertical axis is labelled in units 1-25. Thus Table 25 shown in FIG. 14 may be referenced using the co-ordinates (D,16).

Table 1 below illustrates an example of power figures obtained from the various desks and rooms of the floorplan 1400, referenced in accordance with the grid of FIG. 15. Thus, Table 25, referenced as (D,16) has a power consumption figure of 500. Depending on the implementation and the application, the power consumption figure may be an instantaneous reading, an average reading over a predefined period of time, a cumulative reading over a period of time, or any combination thereof. In this example, the power consumption figure of 500 corresponds to 500 Wh over a period of a day.

TABLE 1

|    | A   | B   | C | D   | E   | F | G   | H   |
|----|-----|-----|---|-----|-----|---|-----|-----|
| 1  | 0   | 50  | 0 | 0   | 0   | 0 | 0   | 0   |
| 2  | 400 | 0   | 0 | 0   | 0   | 0 | 0   | 0   |
| 3  | 0   | 0   | 0 | 0   | 0   | 0 | 0   | 0   |
| 4  | 100 | 0   | 0 | 0   | 100 | 0 | 0   | 0   |
| 5  | 5   | 5   | 0 | 0   | 0   | 0 | 0   | 0   |
| 6  | 0   | 0   | 0 | 0   | 0   | 0 | 0   | 0   |
| 7  | 400 | 80  | 0 | 80  | 150 | 0 | 0   | 0   |
| 8  | 600 | 600 | 0 | 200 | 300 | 0 | 0   | 0   |
| 9  | 0   | 0   | 0 | 0   | 0   | 0 | 0   | 0   |
| 10 | 400 | 500 | 0 | 5   | 40  | 0 | 0   | 0   |
| 11 | 500 | 500 | 0 | 10  | 150 | 0 | 0   | 0   |
| 12 | 0   | 0   | 0 | 0   | 0   | 0 | 0   | 0   |
| 13 | 300 | 180 | 0 | 0   | 0   | 0 | 0   | 0   |
| 14 | 100 | 5   | 0 | 0   | 0   | 0 | 0   | 0   |
| 15 | 0   | 0   | 0 | 0   | 0   | 0 | 0   | 0   |
| 16 | 120 | 60  | 0 | 500 | 30  | 0 | 150 | 100 |
| 17 | 150 | 150 | 0 | 500 | 500 | 0 | 150 | 200 |
| 18 | 0   | 0   | 0 | 0   | 0   | 0 | 0   | 0   |
| 19 | 50  | 150 | 0 | 250 | 10  | 0 | 0   | 0   |
| 20 | 30  | 0   | 0 | 250 | 10  | 0 | 0   | 0   |
| 21 | 0   | 0   | 0 | 50  | 0   | 0 | 0   | 0   |
| 22 | 100 |     |   | 50  | 0   | 0 | 0   | 0   |
| 23 | 0   | 0   | 0 | 0   | 0   | 0 | 0   | 0   |
| 24 | 10  | 0   | 0 | 0   | 0   | 0 | 0   | 0   |
| 25 | 10  | 0   | 0 | 0   | 0   | 0 | 0   | 0   |

The power consumption figures shown in Table 1 are also overlaid on the floorplan 1400 in FIG. 15. It can be seen from FIGS. 14 and 15 that two power outlets in Meeting Room 1 (A, 24-25) have relatively low power usage of 10 Wh each, whereas Tables 7 and 8, of the Operations Department, have relatively high power usage figures of 600 Wh each. Similarly, Table 1 shows no power consumption in Column C, as that region of the floorplan corresponds to a corridor or walkway. Other electrical data and/or metadata can also be used in place of the power consumption data.

Figure 16:
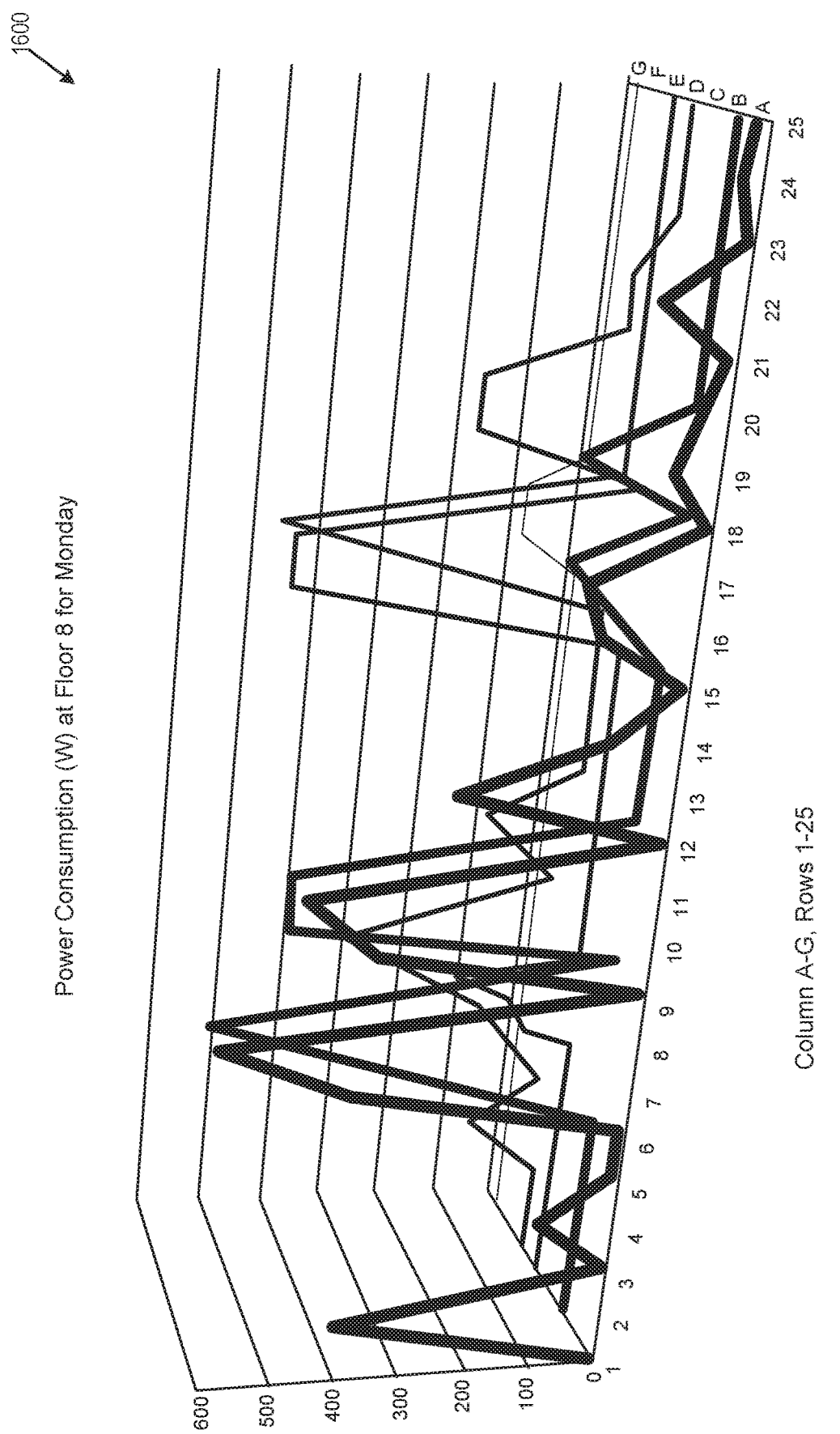
FIG. 16 is a graph showing energy consumption of the sensor locations of the floorplan of FIG. 14 consistent with embodiments disclosed herein.

FIG. 16 shows an energy consumption heat map 1600 illustrating distribution of energy consumption across the floorplan 1400. From the heat map 1600, it is readily apparent that some locations of the floorplan 1400 use large amounts of power and other locations use small amounts of power. Such information can be used to plan installation of new power outlets, distribution of workspaces, reallocation of workspaces, and the like.

Figure 17:
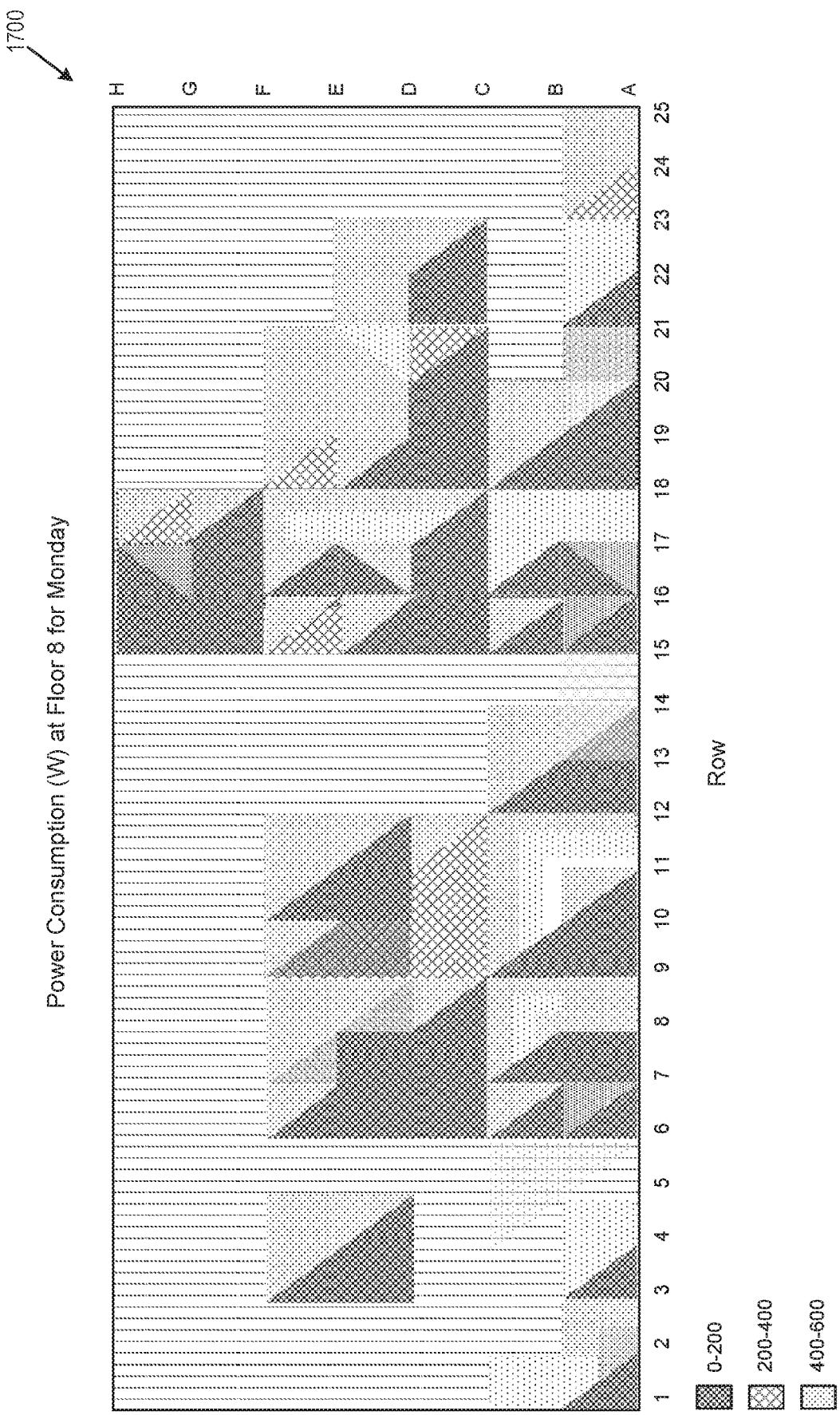
FIG. 17 is an alternative graph showing energy consumption of the sensor locations of the floorplan of FIG. 14 consistent with embodiments disclosed herein.

FIG. 17 shows an alternative energy consumption heat map 1700 illustrating distribution of energy consumption across the floorplan 1400 from a top plan view. This view makes it easier to identify walkways and unused office space. Different colours or shading intensities may be used to differentiate different energy consumption levels.

In one arrangement, each end device performs a mandatory self-diagnostic test upon startup. This provides general information about the overall health of the desk to which the device is attached. In one implementation, a microcontroller on each end device performs the self-diagnostic test. The overall health of the desk to which the device is attached may be assessed based one or more parameters, including, for example, but not limited to, transmitter link status, network status, feedback response from relays within the device, response from power meter, and the like. The microcontroller may perform such a self-diagnostic test by executing computer code instructions stored on, or accessible by, the microcontroller.

If the self-diagnostic test reveals a problem, only the affected feature is disabled, so that unaffected features can continue to be used without affecting uptime. This is only temporary, because the status is reported to the command centre console for further action. For example, using the example of FIG. 10, if the microcontroller 1050 detects that relay 1015, fails due to lack of response or an incorrect response during the self-diagnostic test, the microcontroller 1050 is able to disable relay 1015 via the control line 1065. The microcontroller 1050 is then able to report the fault to a central server via the transmitter 1055. In the event that a fault resides in the transmitter 1055, then the microcontroller 1050 would be unable to download new settings or policies or report power usage data back to the central server. In one arrangement, the microcontroller 1050 is adapted to bypass a defective component in order to maintain substantially normal operation. In one arrangement, the central server listens for a periodic heartbeat signal from each end device and issues an alert if a heartbeat signal is not received within a predefined time period.

Figure 9:
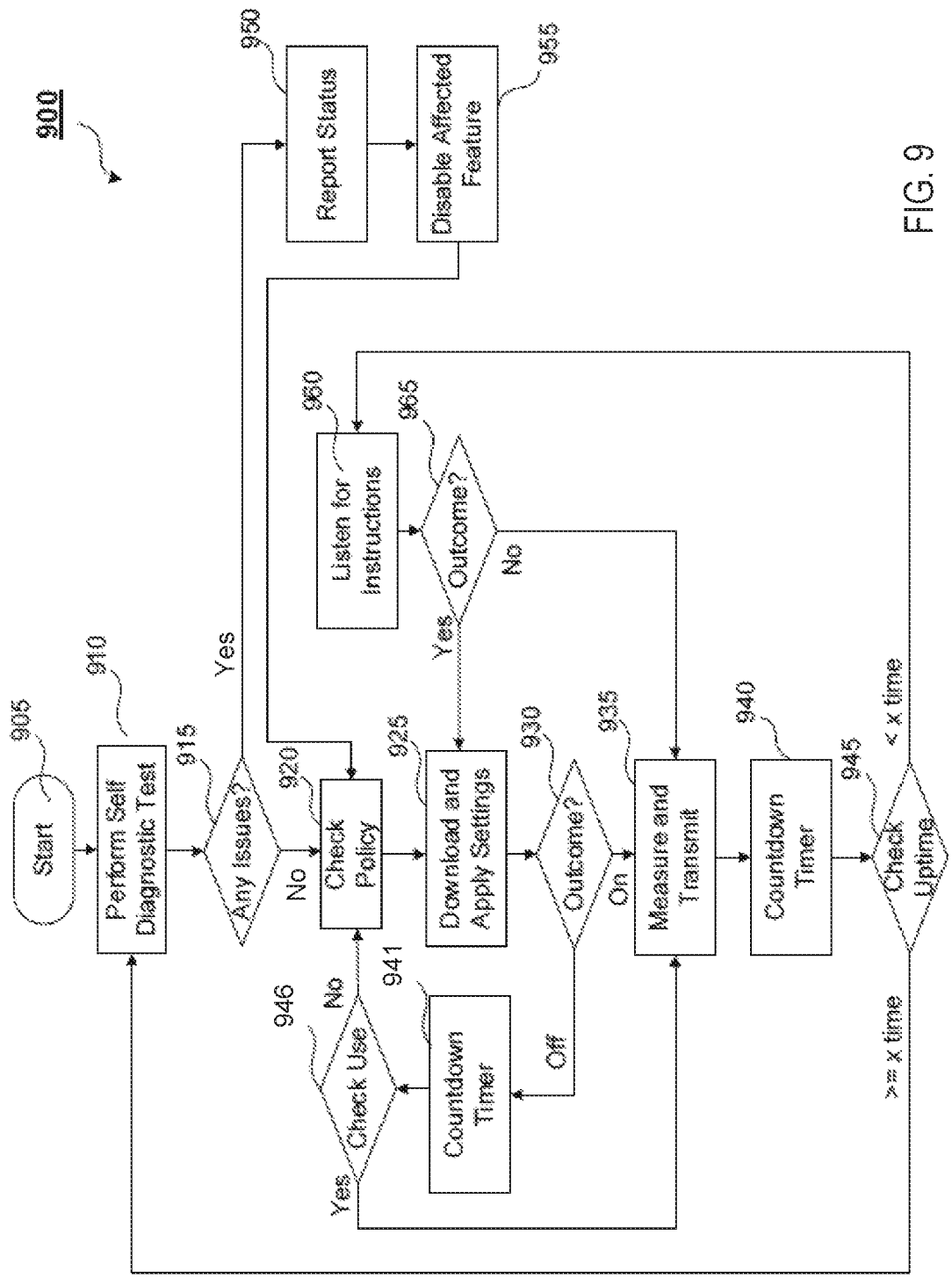
FIG. 9 is a flow diagram illustrating a method for self-diagnostics and operation of an end device embodying a power management device consistent with embodiments disclosed herein.

Each sensor end device is assigned a sensor identifier (ID). The sensor ID corresponds to a physical location at which the end device is deployed. The dashboard of the control user interface is adapted to display the various sensor IDs. FIG. 9 is a flow diagram of a self-diagnostic test method 900. The method 900 begins at a Start step 905 and proceeds to step 910, which performs the self-diagnostic test.

Decision step 915 determines whether there are any issues. If the self diagnostic test reveals no issues, No, control passes to step 920, which checks a policy. The policy determines what configuration has been chosen by an organisation (e.g., switch on relay 1, switch off relay 2, etc.). In step 925, the system downloads and applies the settings and then proceeds with normal operations. Control passes to decision step 930. Step 930 determines the outcome from downloading settings that happened in Step 925. If the settings are OFF (e.g., night mode), then step 930 triggers an "Off" countdown loop. If the settings are ON (e.g., day mode), then step 930 triggers the normal loop. So, if step 930 identifies an "ON" outcome, control passes to step 935. At predefined time intervals, the end device measures and transmits energy consumption information, as shown in step 935. During normal operations, additional sub flows are inserted to allow for on-the-go changes, to force overwrite during off peak use (e.g., employees returning to work outside of normal hours), etc.

Control passes to step 940 which performs a countdown timer and then proceeds to decision step 945. Decision step 945 determines whether a certain interval (e.g., >a certain uptime) has passed. If the interval has passed, Yes, the end device returns to the top of the flow chart to step 910 to perform the self-diagnostic test again. This information provides a real-time effect to the command centre console on the overall health of the entire building or floor.

However, if at step 945 the interval has not expired, No, control passes to step 960, which listens for instructions. For example, if the countdown timer is set to a predefined first timer interval of 30 minutes and the interval is set to 8 hours, then steps 940, 945, and 960 in combination will listen for new instructions every 30 minutes for up to 8 hours. Further, the countdown timer of step 940 and the interval of step 945 assist in distributing data/query traffic among all of the end devices, so that different end devices are able to listen and/or download at different intervals. Control then passes to decision step 965, which determines if there is an outcome or not based on a response from the central control unit (e.g., 730 in FIG. 7). If there is an outcome, Yes, indicating that there are changes, control returns to step 925. If there is not an outcome, No, indicating that there are no new change, control passes to step 935.

Returning to step 915, if there are issues identified in the self-diagnostic test, Yes, control passes from step 915 to step 950, which reports the status of the end device to the central server. Control then passes to step 955, which disables the affected feature. Control then passes to step 920.

Returning to step 930, if the outcome is OFF, control passes to step 941, which activates a countdown timer. Control then passes to step 946, which determines use. If use is Yes, control passes to step 935. However, if use is No, control returns to step 920.

Figure 12:
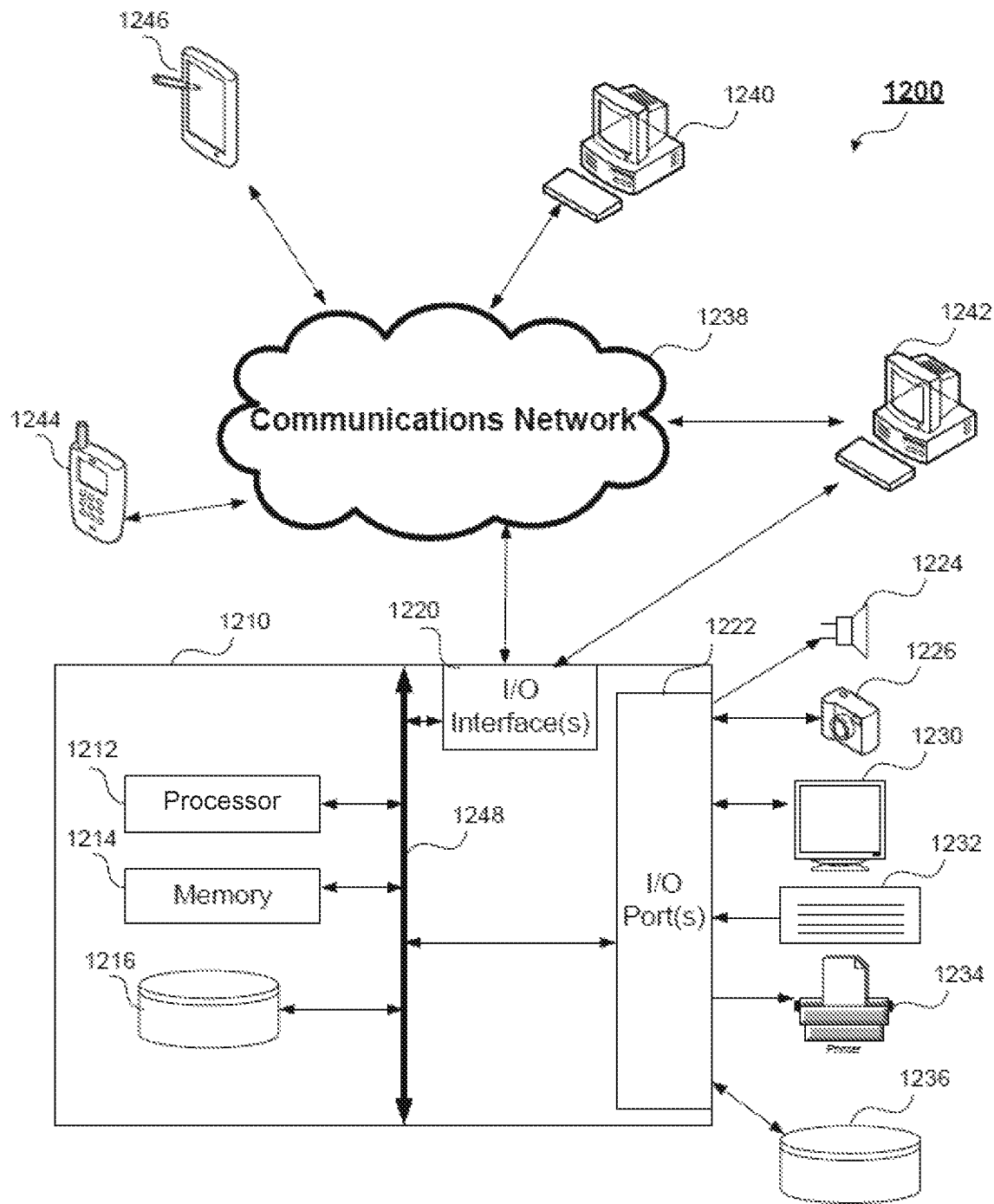
FIG. 12 is a schematic block diagram representation of a system that includes a general purpose computer on which one or more embodiments of the present disclosure may be practised consistent with embodiments disclosed herein.

The power management system of the present disclosure may be practised using a computing device, such as a general purpose computer or computer server. FIG. 12 is a schematic block diagram of a system 1200 that includes a general purpose computer 1210. The general purpose computer 1210 includes a plurality of components, including: a processor 1212, a memory 1214, a storage medium 1216, input/output (I/O) interfaces 1220, and input/output (I/O) ports 1222. Components of the general purpose computer 1210 generally communicate using one or more buses 1248.

The memory 1214 may be implemented using Random Access Memory (RAM), Read Only Memory (ROM), or a combination thereof. The storage medium 1216 may be implemented as one or more of a hard disk drive, a solid state "flash" drive, an optical disk drive, or other storage means. The storage medium 1216 may be utilised to store one or more computer programs, including an operating system, software applications, and data. In one mode of operation, instructions from one or more computer programs stored in the storage medium 1216 are loaded into the memory 1214 via the bus 1248. Instructions loaded into the memory 1214 are then made available via the bus 1248 or other means for execution by the processor 1212 to implement a mode of operation in accordance with the executed instructions.

One or more peripheral devices may be coupled to the general purpose computer 1210 via the I/O ports 1222. In the example of FIG. 12, the general purpose computer 1210 is coupled to each of a speaker 1224, a camera 1226, a display device 1230, an input device 1232, a printer 1234, and an external storage medium 1236. The speaker 1224 may be implemented using one or more speakers, such as in a stereo or surround sound system.

The camera 1226 may be a webcam, or other still or video digital camera, and may download and upload information to and from the general purpose computer 1210 via the I/O ports 1222, dependent upon the particular implementation. For example, images recorded by the camera 1226 may be uploaded to the storage medium 1216 of the general purpose computer 1210. Similarly, images stored on the storage medium 1216 may be downloaded to a memory or storage medium of the camera 1226. The camera 1226 may include a lens system, a sensor unit, and a recording medium.

The display device 1230 may be a computer monitor, such as a cathode ray tube screen, plasma screen, or liquid crystal display (LCD) screen. The display 1230 may receive information from the computer 1210 in a conventional manner, wherein the information is presented on the display device 1230 for viewing by a user. The display device 1230 may optionally be implemented using a touch screen to enable a user to provide input to the general purpose computer 1210. The touch screen may be, for example, a capacitive touch screen, a resistive touchscreen, a surface acoustic wave touchscreen, or the like.

The input device 1232 may be a keyboard, a mouse, a stylus, drawing tablet, or any combination thereof, for receiving input from a user. The external storage medium 1236 may include an external hard disk drive (HDD), an optical drive, a floppy disk drive, a flash drive, solid state drive (SSD), or any combination thereof and may be implemented as a single instance or multiple instances of any one or more of those devices. For example, the external storage medium 1236 may be implemented as an array of hard disk drives.

The I/O interfaces 1220 facilitate the exchange of information between the general purpose computing device 1210 and other computing devices. The I/O interfaces may be implemented using an internal or external modem, an Ethernet connection, or the like, to enable coupling to a transmission medium. In the example of FIG. 12, the I/O interfaces 1222 are coupled to a communications network 1238 and directly to a computing device 1242. The computing device 1242 is shown as a personal computer, but may be equally be practised using a smartphone, laptop, or a tablet device. Direct communication between the general purpose computer 1210 and the computing device 1242 may be implemented using a wireless or wired transmission link.

The communications network 1238 may be implemented using one or more wired or wireless transmission links and may include, for example, a dedicated communications link, a local area network (LAN), a wide area network (WAN), the Internet, a telecommunications network, or any combination thereof. A telecommunications network may include, but is not limited to, a telephony network, such as a Public Switch Telephony Network (PSTN), a mobile telephone cellular network, a short message service (SMS) network, or any combination thereof. The general purpose computer 1210 is able to communicate via the communications network 1238 to other computing devices connected to the communications network 1238, such as the mobile telephone handset 1244, the touchscreen smartphone 1246, the personal computer 1240, and the computing device 1242.

One or more instances of the general purpose computer 1210 may be utilised to implement a server acting as a control data server to implement a power management system in accordance with the present disclosure. In such an embodiment, the memory 1214 and storage 1216 are utilised to store data relating to power information for one or more installations, such as desks in an office workspace. Software for implementing the power management system is stored in one or both of the memory 1214 and storage 1216 for execution on the processor 1212. The software includes computer program code for implementing method steps in accordance with the method of power monitoring described herein.

Figure 13:
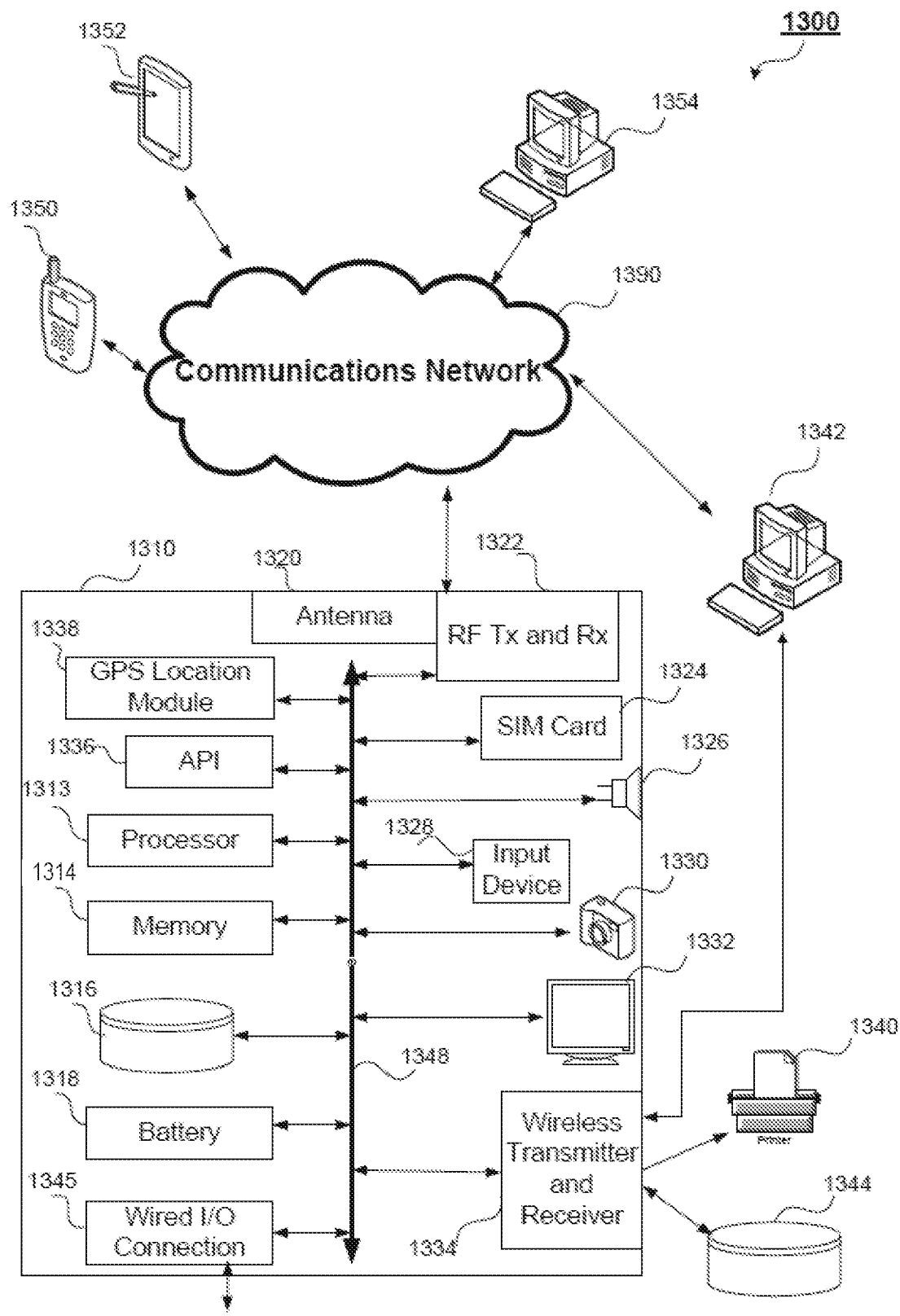
FIG. 13 is a schematic block diagram representation of a system that includes a general smartphone on which one or more embodiments of the present disclosure may be practised consistent with embodiments disclosed herein.

FIG. 13 is a schematic block diagram of a system 1300 on which one or more aspects of a power monitoring method and system of the present disclosure may be practised. The system 1300 includes a portable computing device in the form of a smartphone 1310, which may be used by a registered user of the power monitoring system in FIG. 7. The smartphone 1310 includes a plurality of components, including: a processor 1312, a memory 1314, a storage medium 1316, a battery 1318, an antenna 1320, a radio frequency (RF) transmitter and receiver 1322, a subscriber identity module (SIM) card 1324, a speaker 1326, an input device 1328, a camera 1330, a display 1332, and a wireless transmitter and receiver 1334. Components of the smartphone 1310 generally communicate using one or more bus connections 1348 or other connections therebetween. The smartphone 1310 also includes a wired connection 1345 for coupling to a power outlet to recharge the battery 1318 or for connection to a computing device, such as the general purpose computer 1210 of FIG. 12. The wired connection 1345 may include one or more connectors and may be adapted to enable uploading and downloading of content from and to the memory 1314 and SIM card 1324.

The smartphone 1310 may include many other functional components, such as an audio digital-to-analogue and analogue-to-digital converter and an amplifier, but those components are omitted for the purpose of clarity. However, such components would be readily known and understood by a person skilled in the relevant art.

The memory 1314 may include Random Access Memory (RAM), Read Only Memory (ROM), or a combination thereof. The storage medium 1316 may be implemented as one or more of a solid state "flash" drive, a removable storage medium, such as a Secure Digital (SD) or microSD card, or other storage means. The storage medium 1316 may be utilised to store one or more computer programs, including an operating system, software applications, and data. In one mode of operation, instructions from one or more computer programs stored in the storage medium 1316 are loaded into the memory 1314 via the bus 1348. Instructions loaded into the memory 1314 are then made available via the bus 1348 or other means for execution by the processor 1312 to implement a mode of operation in accordance with the executed instructions.

The smartphone 1310 also includes an application programming interface (API) module 1336, which enables programmers to write software applications to execute on the processor 1312. Such applications include a plurality of instructions that may be pre installed in the memory 1314 or downloaded to the memory 1314 from an external source, via the RF transmitter and receiver 1322 operating in association with the antenna 1320 or via the wired connection 1345.

The smartphone 1310 further includes a Global Positioning System (GPS) location module 1338. The GPS location module 1338 is used to determine a geographical position of the smartphone 1310, based on GPS satellites, cellular telephone tower triangulation, or a combination thereof. The determined geographical position may then be made available to one or more programs or applications running on the processor 1312.

The wireless transmitter and receiver 1334 may be utilised to communicate wirelessly with external peripheral devices via Bluetooth, infrared, or other wireless protocol. In the example of FIG. 13, the smartphone 1310 is coupled to each of a printer 1340, an external storage medium 1344, and a computing device 1342. The computing device 1342 may be implemented, for example, using the general purpose computer 1210 of FIG. 12.

The camera 1330 may include one or more still or video digital cameras adapted to capture and record to the memory 1314 or the SIM card 1324 still images or video images, or a combination thereof. The camera 1330 may include a lens system, a sensor unit, and a recording medium. A user of the smartphone 1310 may upload the recorded images to another computer device or peripheral device using the wireless transmitter and receiver 1334, the RF transmitter and receiver 1322, or the wired connection 1345.

In one example, the display device 1332 is implemented using a liquid crystal display (LCD) screen. The display 1332 is used to display content to a user of the smartphone 1310. The display 1332 may optionally be implemented using a touch screen, such as a capacitive touch screen or resistive touchscreen, to enable a user to provide input to the smartphone 1310.

The input device 1328 may be a keyboard, a stylus, or microphone, for example, for receiving input from a user. In the case in which the input device 1328 is a keyboard, the keyboard may be implemented as an arrangement of physical keys located on the smartphone 1310. Alternatively, the keyboard may be a virtual keyboard displayed on the display device 1332.

The SIM card 1324 is utilised to store an International Mobile Subscriber Identity (IMSI) and a related key used to identify and authenticate the user on a cellular network to which the user has subscribed. The SIM card 1324 is generally a removable card that can be used interchangeably on different smartphone or cellular telephone devices. The SIM card 1324 can be used to store contacts associated with the user, including names and telephone numbers. The SIM card 1324 can also provide storage for pictures and videos. Alternatively, contacts can be stored on the memory 1314.

The RF transmitter and receiver 1322, in association with the antenna 1320, enable the exchange of information between the smartphone 1310 and other computing devices via a communications network 1390. In the example of FIG. 13, RF transmitter and receiver 1322 enable the smartphone 1310 to communicate via the communications network 1390 with a cellular telephone handset 1350, a smartphone or tablet device 1352, a computing device 1354 and the computing device 1342. The computing devices 1354 and 1342 are shown as personal computers, but each may be equally be practised using a smartphone, laptop, or a tablet device.

The communications network 1390 may be implemented using one or more wired or wireless transmission links and may include, for example, a cellular telephony network, a dedicated communications link, a local area network (LAN), a wide area network (WAN), the Internet, a telecommunications network, or any combination thereof. A telecommunications network may include, but is not limited to, a telephony network, such as a Public Switch Telephony Network (PSTN), a cellular (mobile) telephone cellular network, a short message service (SMS) network, or any combination thereof.

Figure 18:
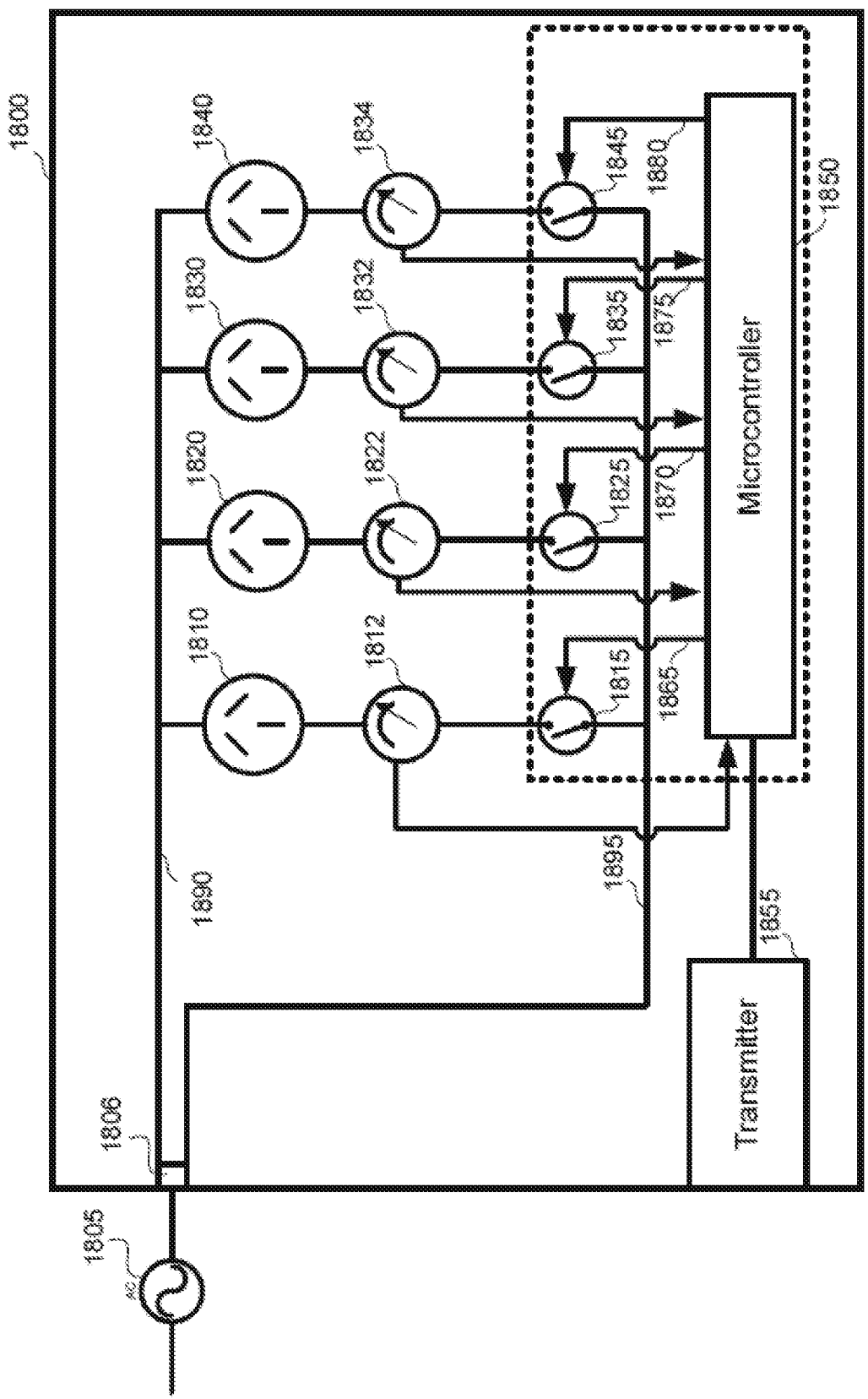
FIG. 18 is a schematic block diagram representation of a power management device embodied in a power board, with a separate power meter for each power outlet consistent with embodiments disclosed herein.

FIG. 18 is a schematic block diagram representation of a power management device embodied in a power board 1800, with a separate power meter for each power outlet. The power board 1800, also known as a power strip, receives an AC mains supply 1805, which is coupled to an input connector 1806. The connector 1806 couples to a top power rail 1890 that feeds each of a first power outlet 1810, a second power outlet 1820, a third power outlet 1830, and a fourth power outlet 1840, all of which are connected in parallel.'

The output of the first power outlet 1810 is connected via a first power meter 1812 to a first relay 1815, which is coupled to a bottom power rail 1895 that returns to the input connector 1806 in order to complete the circuit. The output of the second power outlet 1820 is connected via a second power meter 1822 to a second relay 1825. The output of the third power outlet 1830 is connected via a third power meter 1832 to a third relay 1835. The output of the fourth power outlet 1840 is connected via a fourth power meter 1834 to a fourth relay 1845. The outputs of the second, third, and fourth relays 1825, 1835, and 1845 are all coupled to the bottom power rail 1895.

The power board 1800 further includes a transmitter 1855, which is adapted to couple the power board 1800 to an external communications network. The transmitter 1855 may be implemented using wired or wireless technologies, including, but not limited to, Ethernet, Universal Serial Bus (USB), Wi-Fi, Bluetooth, ZigBee, SigFox, LoRa, 6LoW-PAN, and the like.

The power board 1800 also includes a microcontroller 1850, which is coupled to the transmitter 1855. Where the transmitter 1855 is implemented as a transceiver, an external user can send control signals via the external communications network to the transmitter 1855 and then to the microcontroller 1850. The microcontroller 1850 is also coupled to each of the relays 1815, 1825, 1835, and 1845, via respective control lines 1865, 1870, 1875, 1880 which enable the microcontroller 1850 to control the application of power to each of the respective power outlets 1810, 1820, 1830, 1840.

In an alternative embodiment (not shown), a single relay controls the application of power to each of the set of power outlets 1810, 1820, 1830, 1840. In such an arrangement, all of the power outlets 1810, 1820, 1830, 1840 are controlled together, such that the power outlets 1810, 1820, 1830, 1840 are all turned on or all turned off. In the arrangement shown in FIG. 18, the microcontroller 1850 is able to control power to the power outlets 1810, 1820, 1830, 1840 independently.

The first, second, third, and fourth power meters 1812, 1822, 1832, 1842 record the individual power consumption for the respective power outlets 1810, 1820, 1830, 1840 and transmit recorded power information to the microcontroller 1850. The microcontroller 1850 sends some or all of the recorded power information to the transmitter 1855 for transmission to a remote server.

Figure 19:
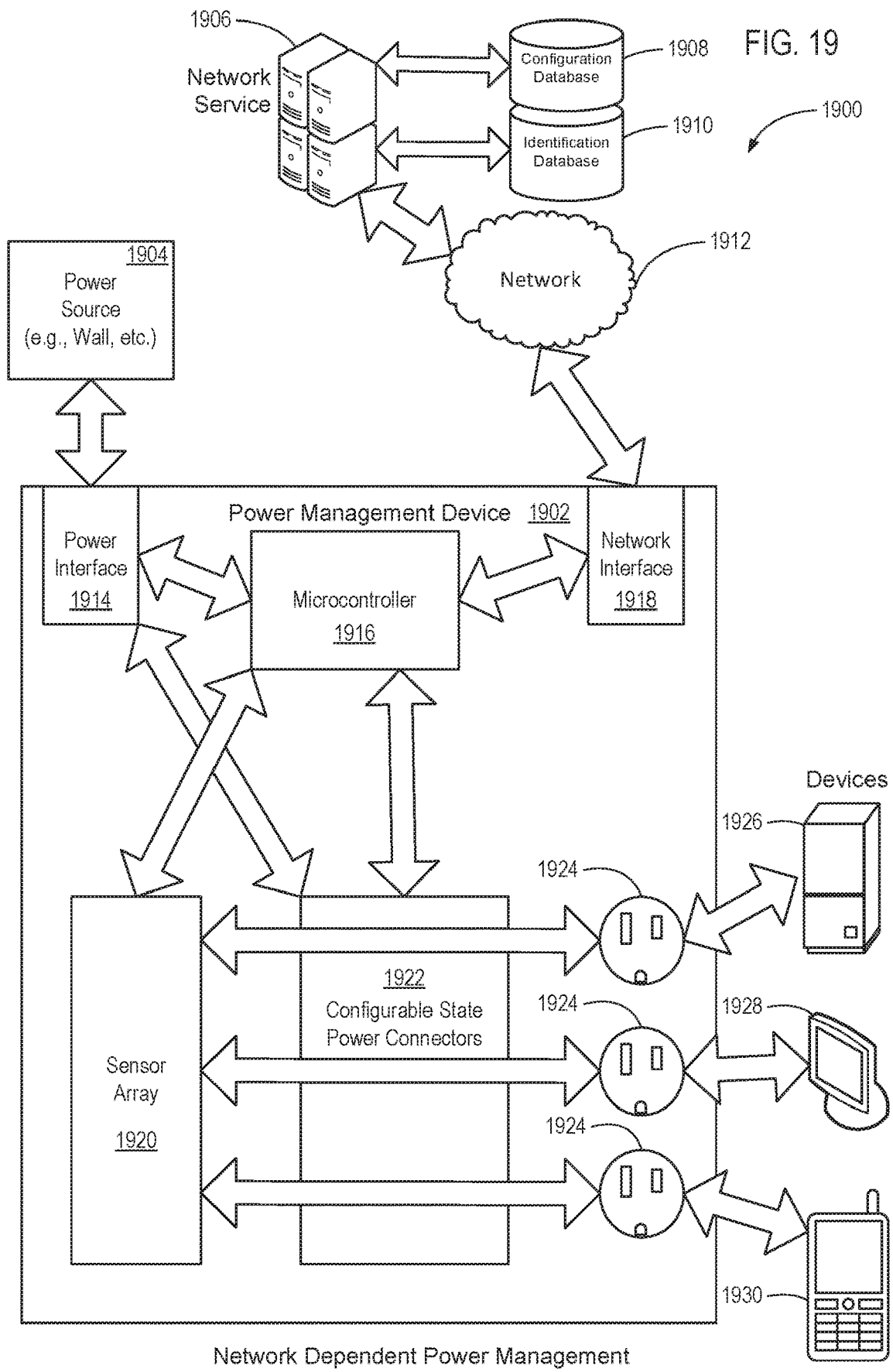
FIG. 19 is a schematic diagram illustrating a power management system with a power management device with an identification service consistent with embodiments disclosed herein.

FIG. 19 is a schematic diagram illustrating a power management system with a power management device with an identification service. In the embodiment shown, a power management device 1902 receives power from a power source 1904 (e.g., a wall socket, battery, fuel cell, etc.) and communicates with a network service 1906 through a network 1912 (such as the Internet or an intranet). The power management device 1902 receives power through a power interface 1914 and communicates with the network service 1906 through a network interface 1918. A microcontroller 1916 can be coupled to the power interface 1914, the network interface 1918, a sensor array 1920 and configurable state power connectors 1922. The configurable state power connectors 1922 are coupled to receptacles 1924 that electrically power and couple to devices 1926, 1928 and 1930.

The network service 1906 is coupled to the network 1912 and includes connections to a configuration database 1908 and an identification database 1910. The network service 1906 can include management functionality that allows for receipt of reports from a set of power management devices and for providing configuration and/or commands to the set of power management devices. The network service 1906 can also provide reporting, data aggregation and/or management functionality for one or more power management devices 1902.

In one embodiment, the configurable state power connectors 1924 are in an "on" state that enables power from the power interface 1914 to be provided through the receptacles 1924. The sensor array 1920 detects a "power on" event at one of the receptacles 1924 from the device 1926 drawing power. A power demand over time waveform is sampled by the sensor array 1920 during the power on event and provided to the microcontroller 1916. The microcontroller 1916 constructs a message that includes the power demand over time waveform to deliver to the network service 1906 using the network interface 1918 coupled to the network 1912.

The network service 1906 can match the power demand over time waveform to a power profile stored in the identification database 1910. Based on the identification (or lack of identification), a configuration for the power management device 1902 can be created based on data from the configuration database 1908. For example, the detected device can be a printer, and an outlet of the power management device 1902 can be assigned a printer tag. A configuration for the power management device 1902 can be altered to include a "power off" state during specified nighttime hours (e.g., 10 pm-5 am).

The network service 1906 can provide the configuration to the power management device 1902 through the network interface 1918. The microcontroller 1916 can store the configuration and operate the configurable state power connectors 1922 based on the configuration.

In some embodiments, the configuration can include parameters about when the configurable state power connectors 1922 can be on or off and when the sensor array 1920 samples power draw from the devices 1926, 1928 and 1930 plugged into the receptacles 1924.

Figure 20:
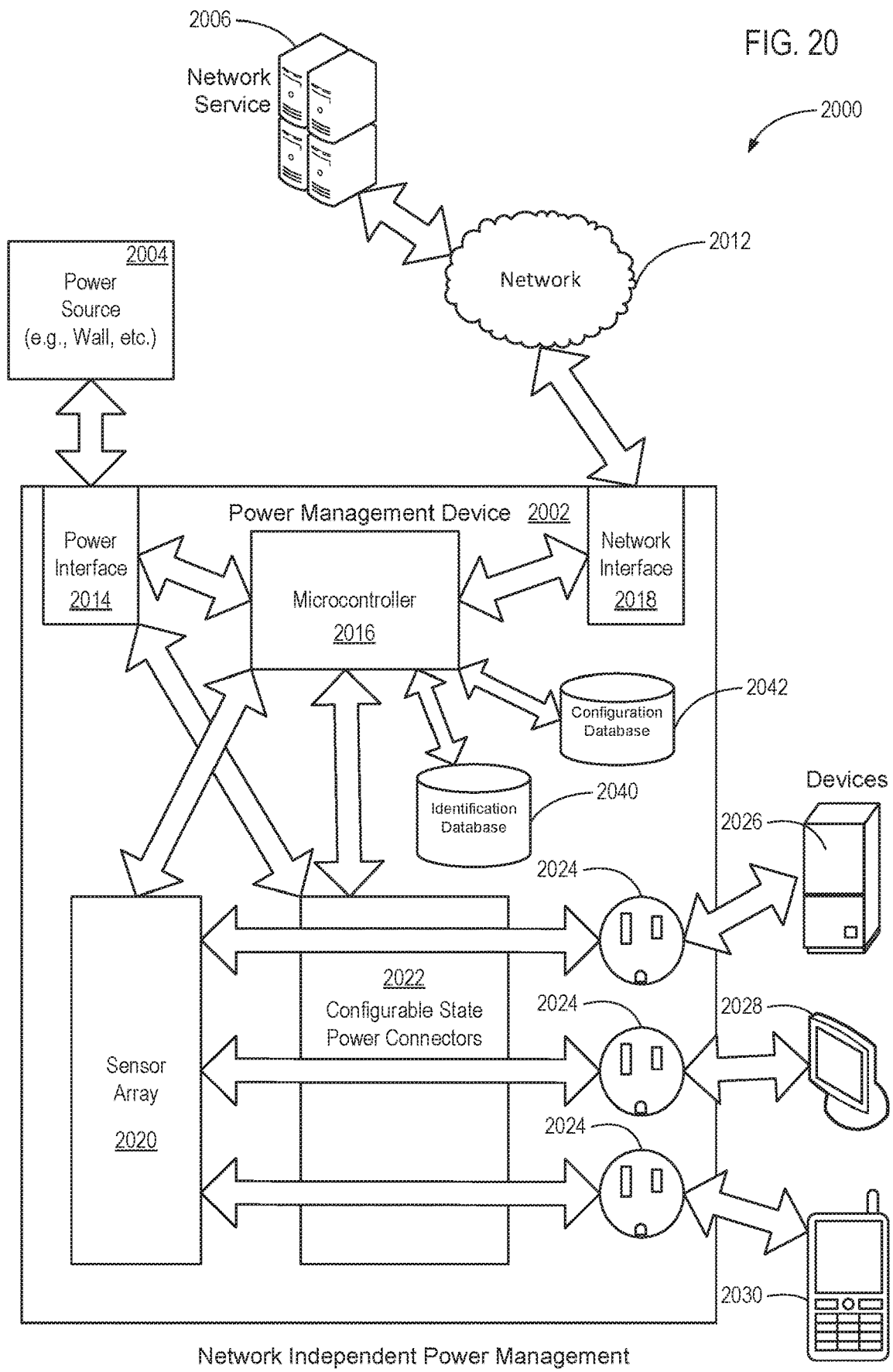
FIG. 20 is a schematic diagram illustrating a power management system with a power management device with local identification consistent with embodiments disclosed herein.

FIG. 20 is a schematic diagram illustrating a power management system with a power management device with local identification. In the embodiment shown, a power management device 2002 receives power from a power source 2004 (e.g., a wall socket, battery, fuel cell, etc.) and communicates with a network service 2006 through a network 2012 (such as the Internet or an intranet). The power management device 2002 receives power through a power interface 2014 and communicates with the network service 2006 through a network interface 2018. A microcontroller 2016 can be coupled to the power interface 2014, the network interface 2018, a sensor array 2020, configurable state power connectors 2022, an identification database 2040 and a configuration database 2042. The configurable state power connectors 2022 are coupled to receptacles 2024 that electrically power and couple to devices 2026, 2028 and 2030.

The network service 2006 is coupled to the network 2012 and can provide reporting, data aggregation and/or management functionality for one or more power management devices 2002. The network service 2006 can include management functionality that allows for receipt of reports from a set of power management devices and providing configuration and/or commands to the set of power management devices.

In one embodiment, the configurable state power connectors 2024 are in an "on" state that enables power from the power interface 2014 to be provided through the receptacles 2024. The sensor array 2020 detects a "power on" event at one of the receptacles 2024 from the device 2026 drawing power. A power demand over time waveform is sampled by the sensor array 2020 during the power on event and provided to the microcontroller 2016. The microcontroller 2016 matches the power demand over time waveform to a power profile stored in the identification database 2040. Based on the identification (or lack of identification), a configuration for the power management device 2002 can be created based on data from the configuration database 2042. For example, the detected device can be a printer, and an outlet of the power management device 2002 can be assigned a printer tag that is reported to the network service 2006. A configuration for the power management device 2002 can be altered to include a "power off" state during specified nighttime hours (e.g., 10 pm-5 am).

The network service 2006 can provide updates to the configuration database 2042 and/or the identification database 2040 of the power management device 2002 through the network interface 2018. The microcontroller 2016 can verify, store and/or apply the updates to current configurations (e.g., rebuild configurations).

In some embodiments, the configuration can include parameters about when the configurable state power connectors 2022 can be on or off and when the sensor array 2020 samples power draw from the devices 2026, 2028 and 2030 plugged into the receptacles 2024.

Figure 21:
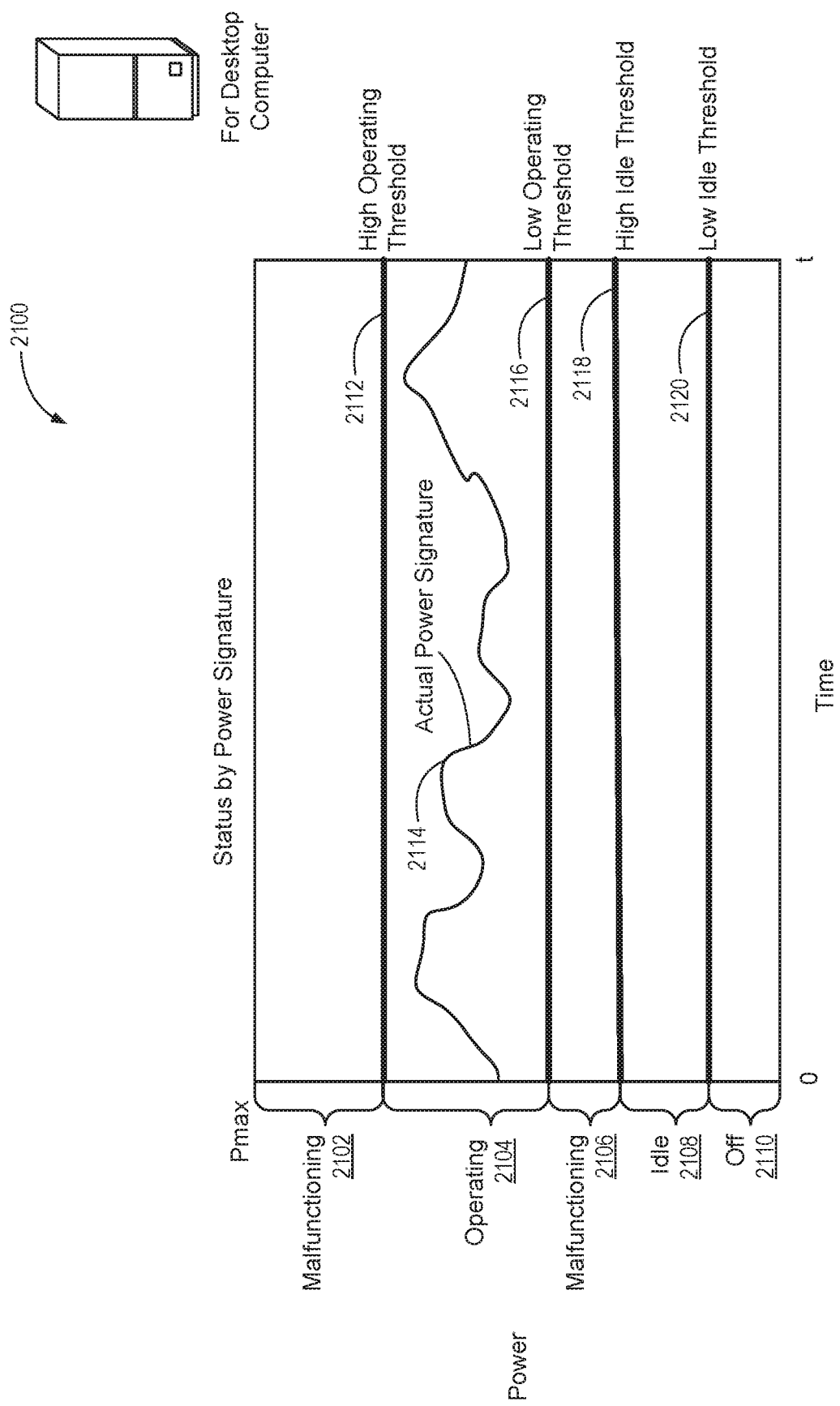
FIG. 21 is a diagram illustrating status determination using power thresholds consistent with embodiments disclosed herein.

FIG. 21 is a diagram 2100 illustrating status determination using power thresholds consistent with embodiments disclosed herein. A power management device can also determine status of an identified device plugged into the power management device based on power usage of the identified device. In the embodiment shown, an operating power profile of a device can include a plurality of thresholds that identify status of the device. Between a high operating threshold 2112 and a low operating threshold 2116, a power signature 2114 of the device indicates an operating status 2104 of the device (e.g., a printer printing sheets of paper, a computer with a user operating it, etc.). Between a high idle threshold 2118 and a low idle threshold 2120, a power signature of the device indicates an idle status 2108 of the device (e.g., a printer or computer in standby mode). Below the low idle threshold 2120, the device can be considered to be in an off state 2110, and off-state (also called vampiric) power use can be identified. Above the high operating threshold 2112, or between the low operating threshold 2116 and the high idle threshold 2118, the device can be considered to be in a malfunctioning state 2102 or 2106. For example, the malfunctioning state 2102 can be a paper jam for a printer that causes sudden power draw of motors above the high operating threshold 2112, or a computer in the malfunctioning state 2106 may be in a crashed state in which power draw is not as high as in the operating state 2104 or as low as in the idle state 2108.

Other status determination methods can also be used. For example, a delay can be applied to a threshold, such that sudden operating spikes or transitions between states do not trigger an alarm. In some embodiments, waveform matching can be used. For example, state determination can be triggered on a rising wave or falling wave. In some embodiments, the resulting waveform after the rising or falling wave can then be matched against a stored waveform to determine state. For example, a printer might have a warm-up waveform, followed by a printing waveform, followed by a printing-wrap-up waveform. The status determination can determine which first status the device is in, which next status follows it, and a workflow of statuses expected. Deviation from an expected status or a status timing beyond a length threshold can trigger an alarm.

Figure 22:
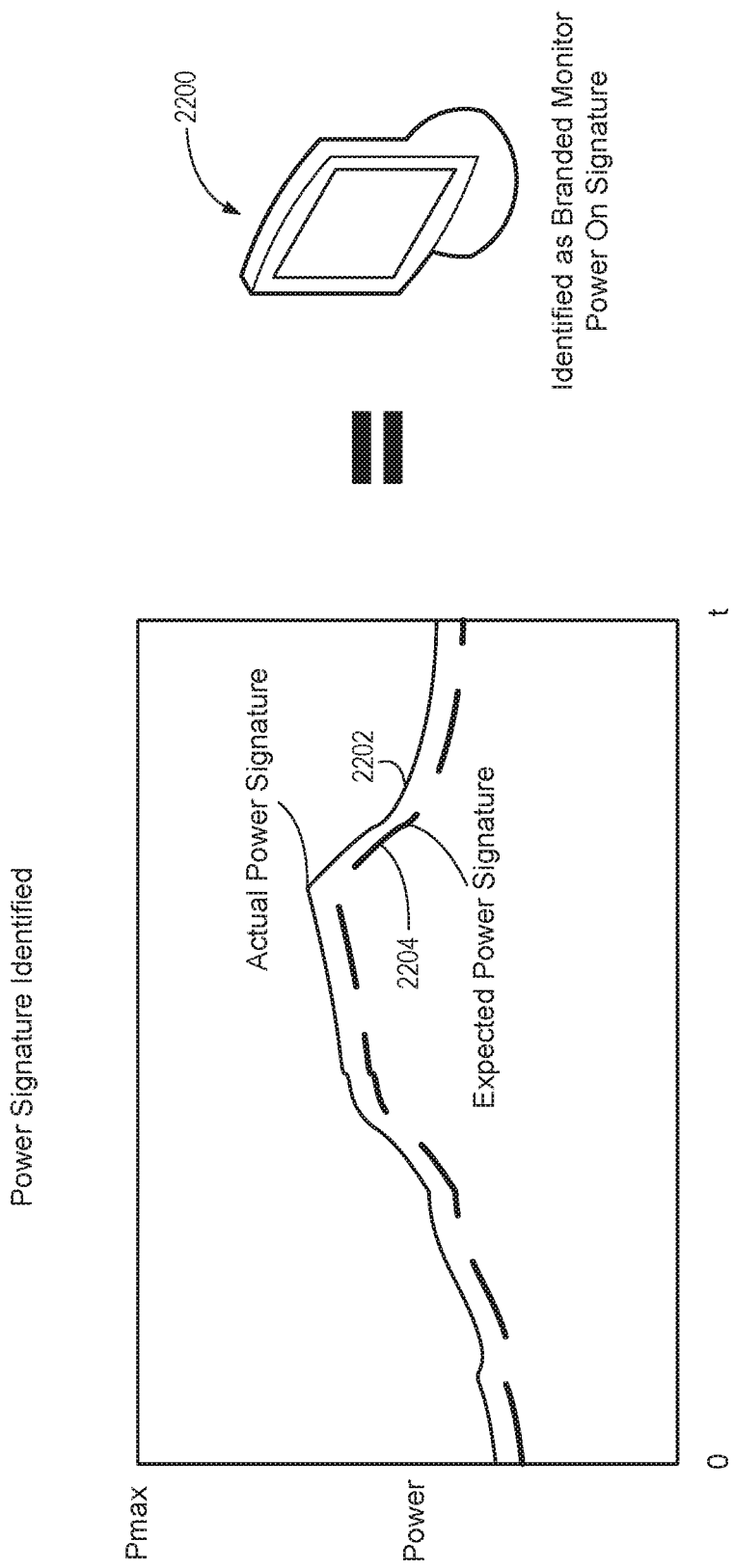
FIG. 22 is a diagram illustrating successful power signature identification using a power profile consistent with embodiments disclosed herein.

FIG. 22 is a diagram illustrating successful power signature identification using a power profile consistent with embodiments disclosed herein. The power management device or network service can match an actual power signature 2202 to an expected power signature 2204 in an identification database. When the signatures match, a device type 2200 (such as a model of a device, such as a Dell 1708FP monitor) can be identified as a device plugged into the power management device. In one embodiment, the power matching is performed by matching slopes at defined points. In another embodiment, the power matching is performed by matching portions of an expected power signature plus or minus a threshold value (or between threshold values). Other matching algorithms are also possible.

Figure 23:
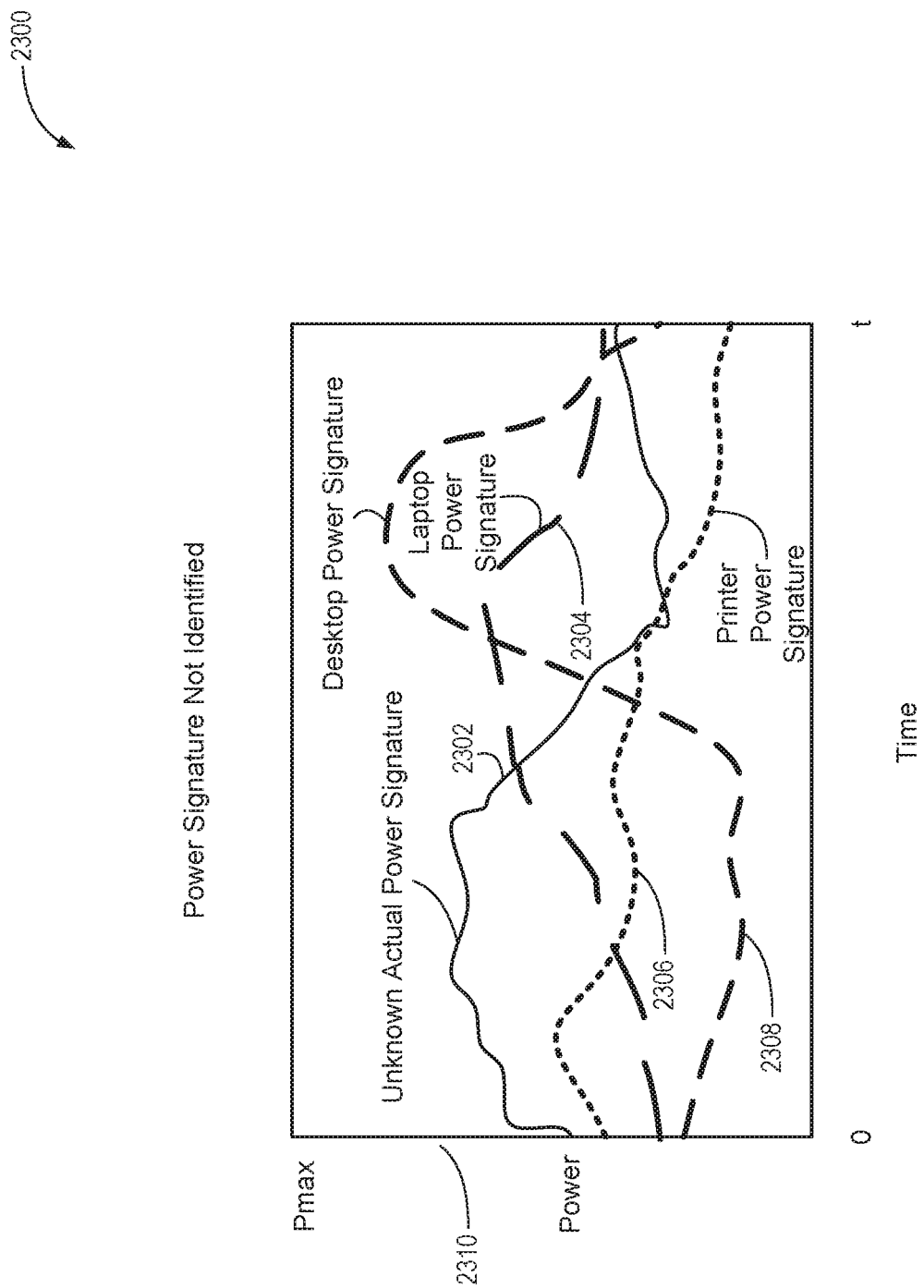
FIG. 23 is a diagram illustrating unsuccessful power signature identification using power profiles consistent with embodiments disclosed herein.

FIG. 23 is a diagram 2300 illustrating unsuccessful power signature identification using power profiles consistent with embodiments disclosed herein. The power management device or network service can attempt to match an actual power signature to an expected power signature in an identification database. In the embodiment shown, an unknown actual power signature 2302 does not match expected power signatures of a desktop power signature 2308, a printer power signature 2306 or a laptop power signature 2304. In an embodiment using matching slopes at defined points, the actual power signature 2302 does not match any of the expected power signatures 2304, 2306 and 2308. In an embodiment using an expected power signature plus or minus a threshold value, the actual power signature 2302 does not match any of the expected power signatures 2304, 2306 and 2308. In some embodiments, a threshold value can vary, such as a threshold varying based on time or slope.

Figure 24:
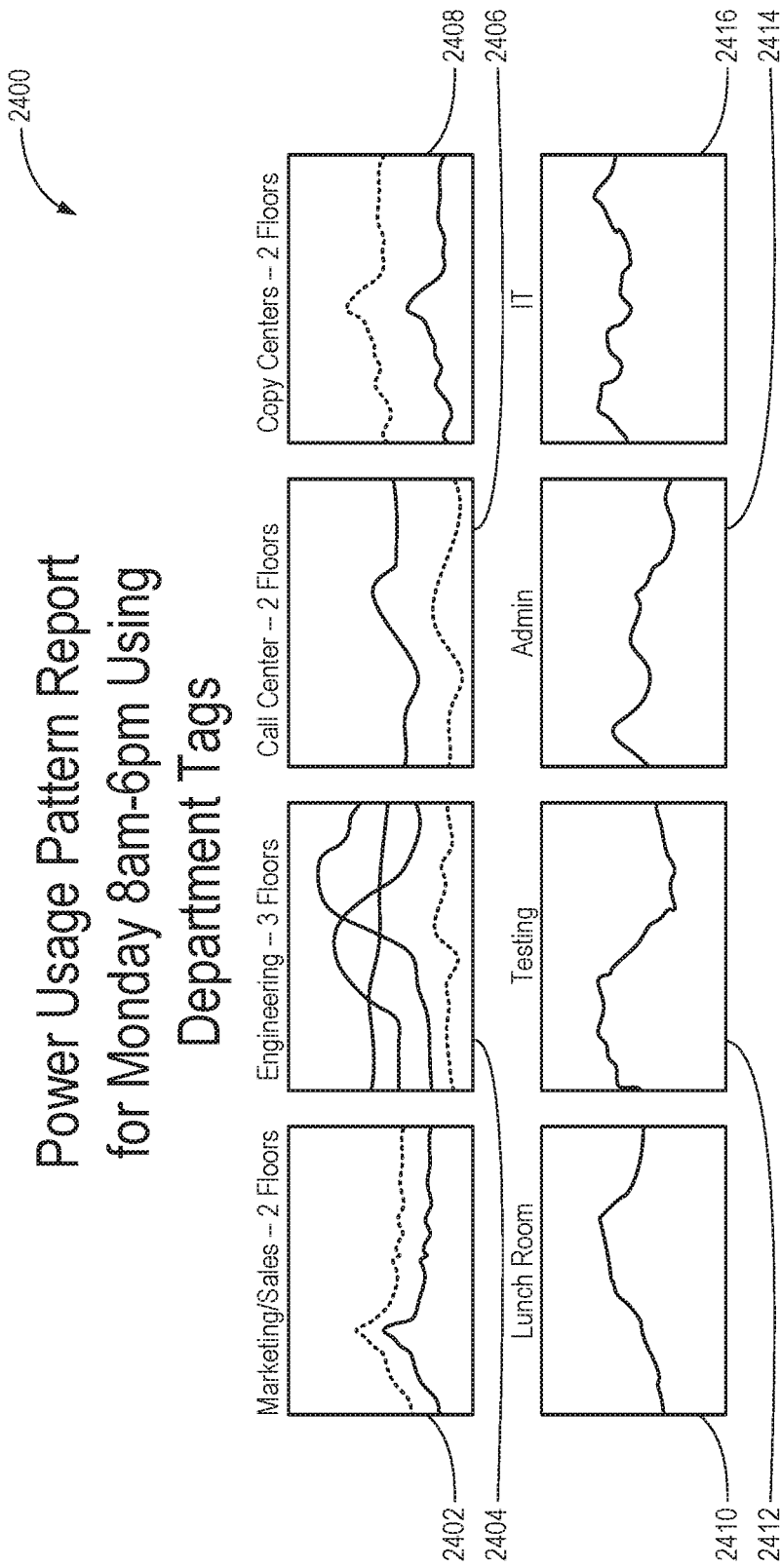
FIG. 24 is a diagram illustrating a screenshot of a dashboard using tag aggregation of power management devices consistent with embodiments disclosed herein.

FIG. 24 is a diagram illustrating a screenshot of a dashboard 2400 using tag aggregation of power management devices consistent with embodiments disclosed herein. In some embodiments, each configurable state power connector of a power management device can be associated with one or more metadata. This metadata can include a tag, which identifies an association with a group. Tags can identify models of equipment (e.g., Dell 1708FP monitor), types of equipment (e.g., monitor, printer, etc.), caretakers or owners of equipment (e.g., Jane Doe), departments (e.g., marketing, sales, engineering, call center, copy center, admin, IT, etc.), or other groups or associations. Reports of data from the power management device to a network service can identify power usage by tag.

Power usage of these groupings can be aggregated and plotted over time. In the embodiment shown in FIG. 24, department power usage is shown by aggregating power usage based on tags representing departments. The graphs can represent average power usage, total power usage or other measurements or statistics as configured or requested. Marketing/Sales department usage is shown in a graph 2402. Engineering department usage is shown in a graph 2404. Call center department usage is shown in a graph 2406. Copy center department usage is shown in a graph 2408. Lunch room usage is shown in a graph 2410. Testing department usage is shown in a graph 2412. Administrative department usage is shown in a graph 2414. IT department usage is shown in a graph 2416. The dashboard 2400 shows the graphs 2402-2416 on a computer screen, as presented by a network service that aggregated the data. This data can be used for capital planning, including power needs (peak and average), as well as potential areas for power reduction.

FIG. 25 is a diagram illustrating a screenshot 2500 of an enhanced asset management system. In one embodiment, an asset management system can tag each configurable state power connector of a power management device with asset information, such as asset name, asset tag and device type. During inventory, a power management system can identify device types coupled to each configurable state power connector and report back to the enhanced asset management system. If the device detected matches a device type tag, then the device is likely the asset expected and can be confirmed. This allows inventory management to focus on mismatches rather than verifying each and every asset tag.

In another embodiment, an asset management system can list devices that are associated with people, desks or places. As the person or desk is assigned equipment, a power management device can also be associated with the people, desk or place. During inventory, a power management system can identify device types coupled to each configurable state power connector and report back to the enhanced asset management system. If the device detected matches a device type tag associated with the person, desk or place, then the device is likely the asset expected and can be confirmed. This allows inventory management to focus on mismatches rather than verifying each and every asset tag.

Figure 26:
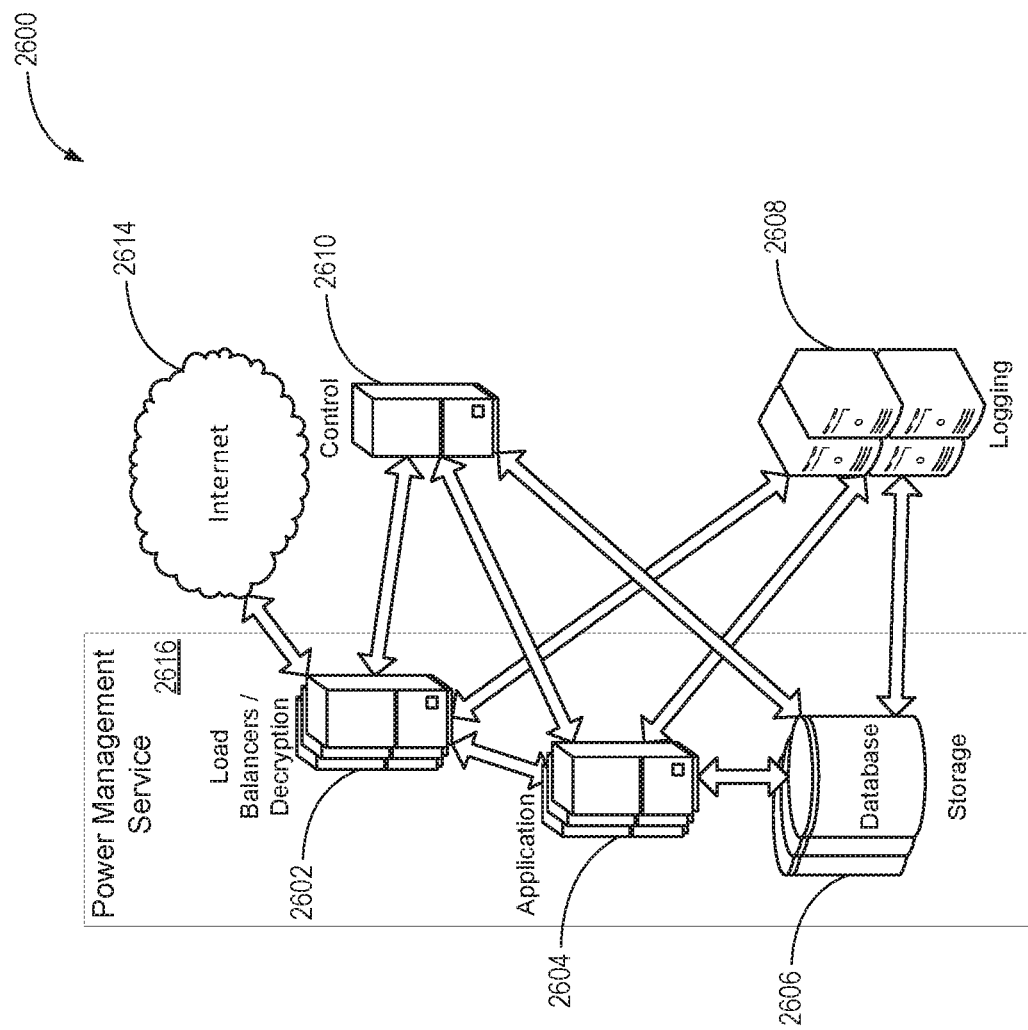
FIG. 26 is system diagram illustrating a system configured to provide services for managing power management devices consistent with embodiments disclosed herein.

FIG. 26 is a system diagram illustrating a system 2600 configured to provide services to a power management device consistent with embodiments disclosed herein. A power management device can communicate with a service 2616 over the Internet 2614 as described above. The service 2616 can include load balancers 2602 capable of decryption, application servers 2604, storage 2606, a control server 2610 and/or a logging server 2608. The load balancers 2602 can receive requests from power management device systems and format the requests to be received by the application servers 2604. The application servers 2604 can receive data from the power management device systems, cause data to be stored by the data servers 2606 and provide administrative reports. The application servers 2604 can provide results (such as aggregated data, average power reports, dashboards, etc.) to the load balancers 2602, which transmit the results to administrative systems. The database servers 2606 can store data regarding the power management devices, tags, configurable state power connectors, power management device configurations, power profiles and/or account information. The control server 2610 can monitor systems of the service 2616 and/or cause servers to be added to pools of servers (such as the load balancers 2602, the application servers 2604 and/or the database servers 2606). The control server 2610 can also provide data integrity/redundancy services such as causing snapshotting, caching and/or other features. The logging server 2608 can track usage and operations performed by the service 2616 and on behalf of the service 2616.

In one example, a user can set up an account with the service 2616 using an application on a mobile device. The user registers an account with the service 2616. The service 2616 can store user credentials in the storage 2606.

Figure 27:
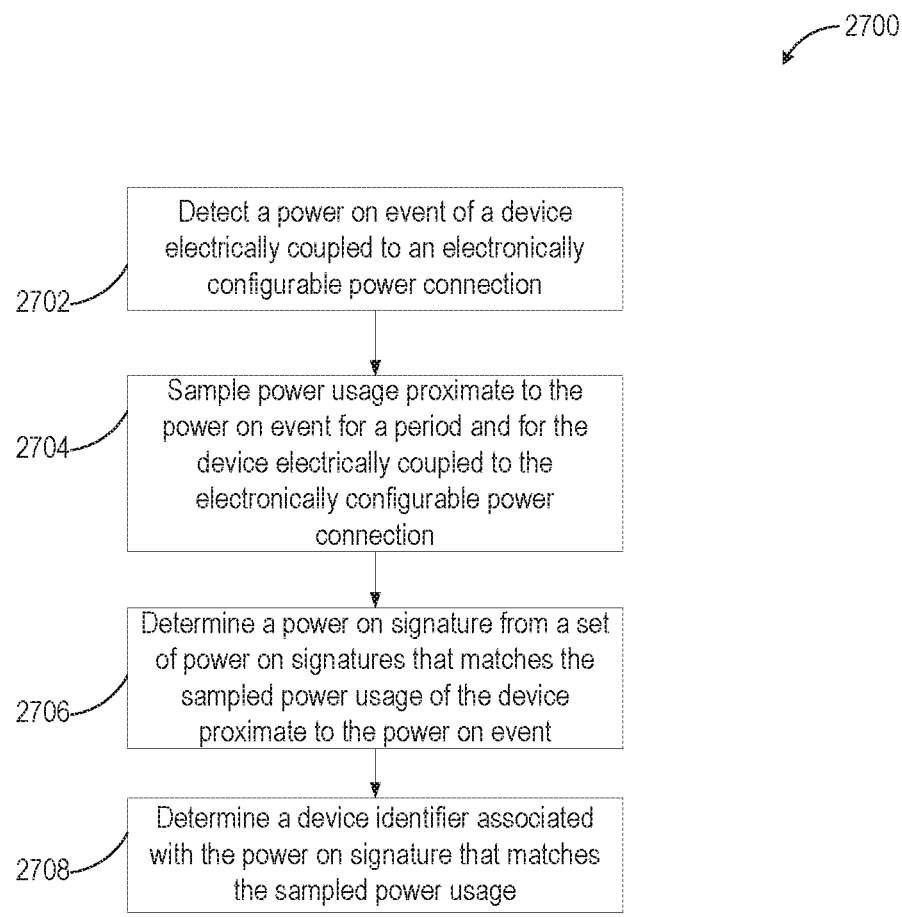
FIG. 27 is a flow chart illustrating a method for power management consistent with embodiments disclosed herein.

FIG. 27 is a flow chart 2700 illustrating a method for power management consistent with embodiments disclosed herein. The method can be accomplished by a power management device and network service as described in FIGS. 1 and/or 2. In block 2702, a power management device detects a "power on" event of a device electrically coupled to an electronically configurable power connection. In block 2704, the power management device samples power usage proximate to the power on event for a period and for the device electrically coupled to the electronically configurable power connection. In block 2706, the power management device determines a power on signature from a set of power on signatures that matches the sampled power usage of the device proximate to the power on event. In block 2708, the power management device determines a device identifier associated with the power on signature that matches the sampled power usage.

Figure 28:
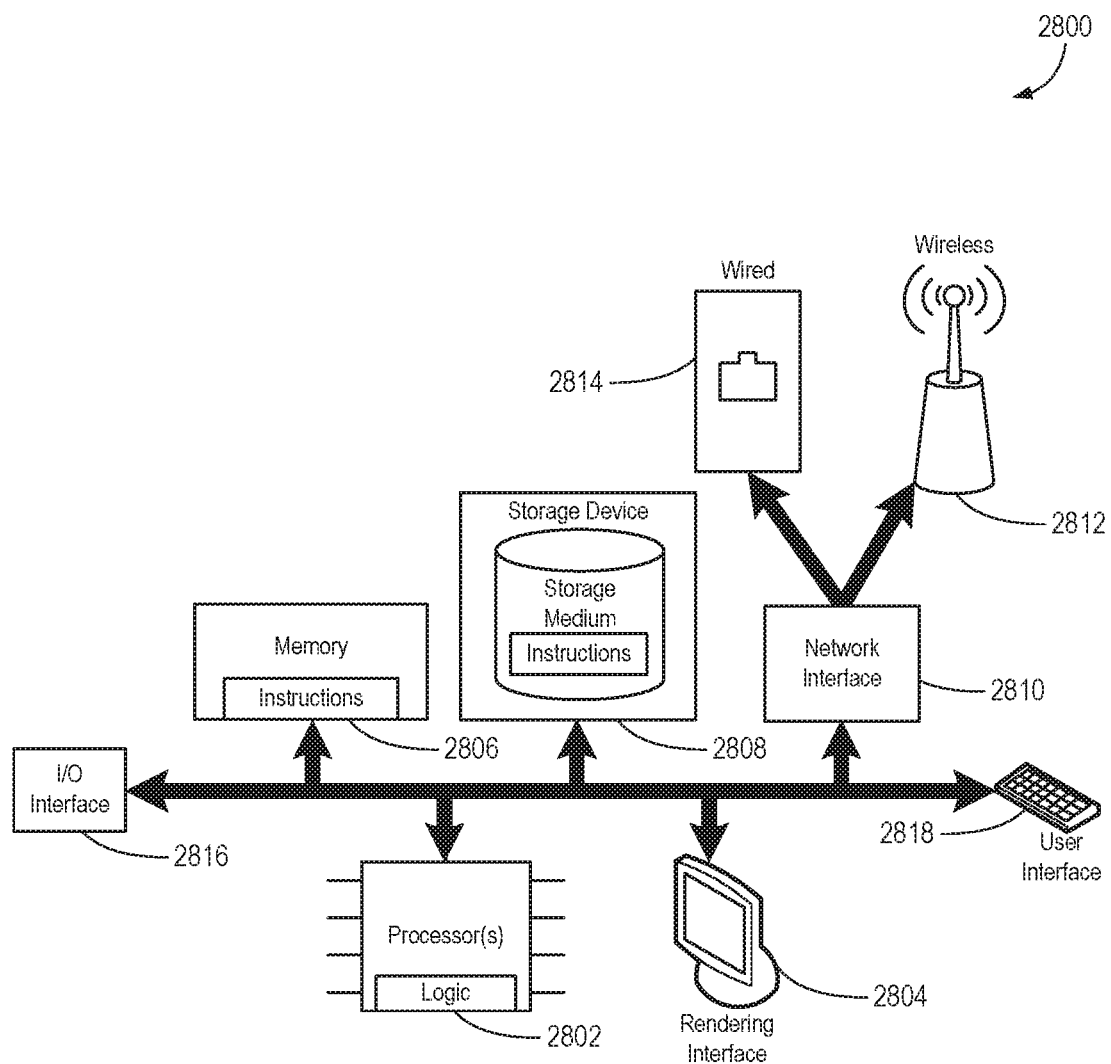
FIG. 28 is schematic diagram of a computing system consistent with embodiments disclosed herein.

FIG. 28 is a schematic diagram of a computing system 2800 consistent with embodiments disclosed herein. The computing system 2800 can be viewed as an information passing bus that connects various components. In the embodiment shown, the computing system 2800 includes a processor having logic 2802 for processing instructions. Instructions can be stored in and/or retrieved from a memory 2806 and a storage device 2808 that includes a computer-readable storage medium. Instructions and/or data can arrive from a network interface 2810 that can include wired 2814 or wireless 2812 capabilities. Instructions and/or data can also come from an I/O interface 2816 that can include such things as expansion cards, secondary buses (e.g., USB, etc.), devices, etc. A user can interact with the computing system 2800 though user interface devices 2818 and a rendering system 2804 that allows the computer to receive and provide feedback to the user.

Examples

The following examples pertain to further embodiments.

Example 1 is a system for providing a status of a remote device. The system includes a set of designable power connectors designed to provide power to removably electrically attached devices, the designable power connectors electronically switchable to on and off states, and a set of sensors attached to the set of designable power connectors, the set of sensors designed to sample an energy consumption characteristic of the devices electrically attached to the set of designable power connectors and designed to transmit sampled energy consumption characteristic data. The system includes a processing unit designed to receive first sampled energy consumption characteristic data from the set of sensors and determine a first device energy consumption profile of a first device attached to a first power connector sampled by a first sensor from the set of sensors. The system includes a processing unit designed to match the first sampled energy consumption characteristic data to a first status described in the first device energy consumption profile and determine whether to perform a first follow-up action based at least in part on the first status.

Example 2 is the system of Example 1, where the energy consumption characteristic includes a power profile.

Example 3 is the system of Example 1, where the energy consumption characteristic includes instantaneous voltage, average voltage, instantaneous amperage, instantaneous wattage or average wattage.

Example 4 is the system of Example 1, where the energy consumption characteristics includes power profile, current profile, electronics signature, electronic waveform or device temperature.

Example 5 is the system of Example 1, further comprising a network interface designed to communicate with a network service, the network service designed to receive energy consumption reports from the system.

Example 6 is the system of Example 5, where the processing unit is further designed to transmit the status to the network service.

Example 7 is the system of Example 5, where the status includes: idling, operating, malfunctioning or off.

Example 8 is the system of Example 1, where to match the first sampled energy consumption characteristic usage data to the first status described in the first device energy consumption profile further includes to determine that the first sampled energy consumption usage data is between an upper status threshold and a lower status threshold.

Example 9 is the system of Example 1, where to determine whether to perform the first follow-up action further includes looking up a status in a reaction database, receiving an associated action from the reaction database, and executing the associated action based at least in part on the status and the first power connector.

Example 10 is the system of Example 1, where the action is to electronically switch off power to the first power connector, transmit an alert message, or perform a time-delayed action.

Example 11 is a network service for managing power consumption. The network includes an application program interface (API) designed to receive power data from a variety of remote power monitoring devices and storage for storing received power data. The network includes a processor unit attached to the API and the storage, the processor unit designed to receive a set of power data from the API, the set of power data describing power draw of the variety of remote power monitoring devices over a period of time, aggregate the set of power data to form subsets of power data based on attributes associated with the remote power monitoring devices, and render at least some of the subsets of power data for display on a display device of a computing resource executing a power management application.

Example 12 is the network service of Example 11, where the power management application is a web-based application.

Example 13 is the network service of Example 11, where the attributes are tags applied to the remote power monitoring devices or tags applied to power couplings of the remote power monitoring devices.

Example 14 is a computer program product including a computer-readable storage medium that stores instructions for execution by a processor to perform operations of a power monitoring equipment, the operations, when executed by the processor, to perform a method. The method includes detecting a power on event of a device electrically attached to an electronically designable power connection and sampling energy consumption proximate to the power on event for a period and for the device electrically attached to the electronically designable power connection. The method includes determining a power on signature from a set of power on signatures that matches the sampled energy consumption of the device proximate to the power on event, and determining a device identifier associated with the power on signature that matches the sampled energy consumption.

Example 15 is the computer program product of Example 14, where sampling energy consumption further includes sampling instantaneous voltage, average voltage, instantaneous amperage, instantaneous wattage or average wattage.

Example 16 is the computer program product of Example 14, where the power on signature includes a power profile, current profile, electronics signature, electronic waveform or device temperature.

Example 17 is the computer program product of Example 14, where the method further includes transmitting an indicator of the device identifier to a network service.

Example 18 is the computer program product of Example 15, where the method further includes receiving an action to implement from the network service based on the device identifier.

Example 19 is the computer program product of Example 16, where the action is performing periodic reporting, transmitting an alert, turning off the electronically designable power connection or performing a time-delayed action.

Example 20 is a network service for device auditing. The network includes an application program interface (API) designed to receive power data from a variety of remote power monitoring devices, and storage for storing received power data. The network includes a processor unit attached to the API and the storage, the processor unit designed to receive a set of power data from the API, the set of power data identifying device models drawing power from the variety of remote power monitoring devices over a period of time based at least in part on a match between a sampled power usage and a device model power usage profile, and determine a set of detected device models attached to an individual power monitoring device. The network includes a processor unit attached to the API and the storage, the processor unit designed to determine which of the set of detected device models matches a set of expected models for the individual power monitoring device based at least in part on the set of power data, provide a set of indications of confirmation that includes an indication of confirmation for each detected device model of the set of detected device models that matches an element of the set of expected models for the individual power monitoring device, and store audit data comprising the indications of confirmation, the set of detected device models and the set of expected models to computer readable media.

Example 21 is the apparatus of Example 18, where the API is further designed to also receive power usage, electrical data or metadata from the variety of remote power monitoring devices.

Example 22 is the apparatus of Example 18, where a subset of power couplings of the variety of remote power monitoring devices are associated with a set of inventory management tags, an inventory management tag stored locally on a remote power monitoring device.

Example 23 is the apparatus of Example 18, where the audit data is stored as a spreadsheet.

Example 24 is the apparatus of Example 20, where the spreadsheet includes columns for the indications of confirmation, the set of detected device models and set of expected models to computer readable media for the variety of remote power monitoring devices.

INDUSTRIAL APPLICABILITY

The arrangements described are applicable to the power industry.

The foregoing describes only some embodiments of the present invention, and modifications and/or changes can be made thereto without departing from the scope and spirit of the invention, the embodiments being illustrative and not restrictive.

In the context of this specification, the word "comprising" and its associated grammatical constructions mean "including principally but not necessarily solely" or "having" or "including," and not "consisting only of." Variations of the word "comprising," such as "comprise" and "comprises," have correspondingly varied meanings.

As used throughout this specification, unless otherwise specified, the use of ordinal adjectives "first," "second," "third," "fourth," etc., to describe common or related objects, indicates that reference is being made to different instances of those common or related objects, and is not intended to imply that the objects so described must be provided or positioned in a given order or sequence, either temporally, spatially, in ranking, or in any other manner.

Although the invention has been described with reference to specific examples, it will be appreciated by those skilled in the art that the invention may be embodied in many other forms.

Embodiments and implementations of the systems and methods described herein may include various operations, which may be embodied in machine-executable instructions to be executed by a computer system. A computer system may include one or more general-purpose or special-purpose computers (or other electronic devices). The computer system may include hardware components that include specific logic for performing the operations or may include a combination of hardware, software, and/or firmware.

Computer systems and the computers in a computer system may be connected via a network. Suitable networks for configuration and/or use as described herein include one or more local area networks, wide area networks, metropolitan area networks, and/or Internet or IP networks, such as the World Wide Web, a private Internet, a secure Internet, a value-added network, a virtual private network, an extranet, an intranet, or even stand-alone machines which communicate with other machines by physical transport of media. In particular, a suitable network may be formed from parts or entireties of two or more other networks, including networks using disparate hardware and network communication technologies.

One suitable network includes a server and one or more clients; other suitable networks may contain other combinations of servers, clients, and/or peer-to-peer nodes, and a given computer system may function both as a client and as a server. Each network includes at least two computers or computer systems, such as the server and/or clients. A computer system may include a workstation, laptop computer, disconnectable mobile computer, server, mainframe, cluster, so-called "network computer" or "thin client," tablet, smartphone, personal digital assistant or other hand-held computing device, "smart" consumer electronics device or appliance, medical device, or a combination thereof.

Suitable networks may include communications or networking software, such as the software available from Novell®, Microsoft®, and other vendors, and may operate using TCP/IP, SPX, IPX, and other protocols over twisted pair, coaxial, or optical fiber cables, telephone lines, radio waves, satellites, microwave relays, modulated AC power lines, physical media transfer, and/or other data transmission "wires" known to those of skill in the art. The network may encompass smaller networks and/or be connectable to other networks through a gateway or similar mechanism.

Various techniques, or certain aspects or portions thereof, may take the form of program code (i.e., instructions) embodied in tangible media, such as floppy diskettes, CD-ROMs, hard drives, magnetic or optical cards, solid-state memory devices, a nontransitory computer-readable storage medium, or any other machine-readable storage medium wherein, when the program code is loaded into and executed by a machine, such as a computer, the machine becomes an apparatus for practicing the various techniques. In the case of program code execution on programmable computers, the computing device may include a processor, a storage medium readable by the processor (including volatile and nonvolatile memory and/or storage elements), at least one input device, and at least one output device. The volatile and nonvolatile memory and/or storage elements may be a RAM, an EPROM, a flash drive, an optical drive, a magnetic hard drive, or other medium for storing electronic data. One or more programs that may implement or utilize the various techniques described herein may use an application programming interface (API), reusable controls, and the like. Such programs may be implemented in a high-level procedural or an object-oriented programming language to communicate with a computer system. However, the program(s) may be implemented in assembly or machine language, if desired. In any case, the language may be a compiled or interpreted language, and combined with hardware implementations.

Each computer system includes one or more processors and/or memory; computer systems may also include various input devices and/or output devices. The processor may include a general purpose device, such as an Intel®, AMD®, or other "off-the-shelf" microprocessor. The processor may include a special purpose processing device, such as ASIC, SoC, SiP, FPGA, PAL, PLA, FPLA, PLD, or other customized or programmable device. The memory may include static RAM, dynamic RAM, flash memory, one or more flip-flops, ROM, CD-ROM, DVD, disk, tape, or magnetic, optical, or other computer storage medium. The input device(s) may include a keyboard, mouse, touch screen, light pen, tablet, microphone, sensor, or other hardware with accompanying firmware and/or software. The output device(s) may include a monitor or other display, printer, speech or text synthesizer, switch, signal line, or other hardware with accompanying firmware and/or software.

It should be understood that many of the functional units described in this specification may be implemented as one or more components, which is a term used to more particularly emphasize their implementation independence. For example, a component may be implemented as a hardware circuit comprising custom very large scale integration (VLSI) circuits or gate arrays, or off-the-shelf semiconductors such as logic chips, transistors, or other discrete components. A component may also be implemented in programmable hardware devices such as field programmable gate arrays, programmable array logic, programmable logic devices, or the like.

Components may also be implemented in software for execution by various types of processors. An identified component of executable code may, for instance, comprise one or more physical or logical blocks of computer instructions, which may, for instance, be organized as an object, a procedure, or a function. Nevertheless, the executables of an identified component need not be physically located together, but may comprise disparate instructions stored in different locations that, when joined logically together, comprise the component and achieve the stated purpose for the component.

Indeed, a component of executable code may be a single instruction, or many instructions, and may even be distributed over several different code segments, among different programs, and across several memory devices. Similarly, operational data may be identified and illustrated herein within components, and may be embodied in any suitable form and organized within any suitable type of data structure. The operational data may be collected as a single data set, or may be distributed over different locations including over different storage devices, and may exist, at least partially, merely as electronic signals on a system or network. The components may be passive or active, including agents operable to perform desired functions.

Several aspects of the embodiments described will be illustrated as software modules or components. As used herein, a software module or component may include any type of computer instruction or computer-executable code located within a memory device. A software module may, for instance, include one or more physical or logical blocks of computer instructions, which may be organized as a routine, program, object, component, data structure, etc., that perform one or more tasks or implement particular data types. It is appreciated that a software module may be implemented in hardware and/or firmware instead of or in addition to software. One or more of the functional modules described herein may be separated into sub-modules and/or combined into a single or smaller number of modules.

In certain embodiments, a particular software module may include disparate instructions stored in different locations of a memory device, different memory devices, or different computers, which together implement the described functionality of the module. Indeed, a module may include a single instruction or many instructions, and may be distributed over several different code segments, among different programs, and across several memory devices. Some embodiments may be practiced in a distributed computing environment where tasks are performed by a remote processing device linked through a communications network. In a distributed computing environment, software modules may be located in local and/or remote memory storage devices. In addition, data being tied or rendered together in a database record may be resident in the same memory device, or across several memory devices, and may be linked together in fields of a record in a database across a network.

Reference throughout this specification to "an example" means that a particular feature, structure, or characteristic described in connection with the example is included in at least one embodiment of the present invention. Thus, appearances of the phrase "in an example" in various places throughout this specification are not necessarily all referring to the same embodiment.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on its presentation in a common group without indications to the contrary. In addition, various embodiments and examples of the present invention may be referred to herein along with alternatives for the various components thereof. It is understood that such embodiments, examples, and alternatives are not to be construed as de facto equivalents of one another, but are to be considered as separate and autonomous representations of the present invention.

Furthermore, the described features, structures, or characteristics may be combined in any suitable manner in one or more embodiments. In the following description, numerous specific details are provided, such as examples of materials, frequencies, sizes, lengths, widths, shapes, etc., to provide a thorough understanding of embodiments of the invention. One skilled in the relevant art will recognize, however, that the invention may be practiced without one or more of the specific details, or with other methods, components, materials, etc. In other instances, well-known structures, materials, or operations are not shown or described in detail to avoid obscuring aspects of the invention.

It should be recognized that the systems described herein include descriptions of specific embodiments. These embodiments can be combined into single systems, partially combined into other systems, split into multiple systems or divided or combined in other ways. In addition, it is contemplated that parameters/attributes/aspects/etc. of one embodiment can be used in another embodiment. The parameters/attributes/aspects/etc. are merely described in one or more embodiments for clarity, and it is recognized that the parameters/attributes/aspects/etc. can be combined with or substituted for parameters/attributes/etc. of another embodiment unless specifically disclaimed herein.

Although the foregoing has been described in some detail for purposes of clarity, it will be apparent that certain changes and modifications may be made without departing from the principles thereof. It should be noted that there are many alternative ways of implementing both the processes and apparatuses described herein. Accordingly, the present embodiments are to be considered illustrative and not restrictive, and the invention is not to be limited to the details given herein, but may be modified within the scope and equivalents of the appended claims.

Those having skill in the art will appreciate that many changes may be made to the details of the above-described embodiments without departing from the underlying principles of the invention. The scope of the present invention should, therefore, be determined only by the following claims.

The invention claimed is:

1. A system for providing a status of a remote device, the system comprising:
   a set of configurable power connectors configured to removably electrically couple to devices and provide power to the devices, the configurable power connectors electronically switchable to on and off states, the set of configurable power connectors configured to perform one or more self-diagnostic tests to detect problems with components of the set of configurable power connectors themselves, wherein the components that are tested include a relay, wherein when a problem is detected in an affected component, the set of configurable power connectors to:
   disable the affected component, and
   bypass the affected component such that the set of configurable power connectors can continue operation;
   a set of sensors coupled to the set of configurable power connectors, the set of sensors configured to sample an energy consumption characteristic of the devices electrically coupled to the set of configurable power connectors and configured to transmit sampled energy consumption characteristic data; and
   a processing unit configured to:
   receive first sampled energy consumption characteristic data from the set of sensors;
   determine a first device energy consumption profile of a first device coupled to a first power connector sampled by a first sensor from the set of sensors;
   match the first sampled energy consumption characteristic data to a first status described in the first device energy consumption profile by determining whether the first sampled energy consumption usage data is between an upper status threshold and a lower status threshold;
   when the first sampled energy consumption usage data is below the lower status threshold, associating the first device with the first status of idling or off;
   when the first sampled energy consumption usage data is above the lower status threshold and under the upper status threshold, associating the first device with the first status of operating;

when the first sampled energy consumption usage data is above the upper status threshold, associating the first device with the first status of malfunctioning; and determine whether to perform a first follow-up action based at least in part on the first status.

2. The system of claim 1, wherein the energy consumption characteristic comprises a power profile.

3. The system of claim 1, wherein the energy consumption characteristic comprises instantaneous voltage, average voltage, instantaneous amperage, instantaneous wattage or average wattage.

4. The system of claim 1, wherein the energy consumption characteristics comprise power profile, current profile, electronics signature, electronic waveform or device temperature.

5. The system of claim 1, further comprising a network interface configured to communicate with a network service, the network service configured to receive energy consumption reports from the system.

6. The system of claim 5, wherein the processing unit is further configured to transmit the status to the network service.

7. The system of claim 5, wherein the status comprises: idling, operating, malfunctioning or off.

8. The system of claim 1, wherein to match the first sampled energy consumption characteristic usage data to the first status described in the first device energy consumption profile further comprises to determine that the first sampled energy consumption usage data is between an upper status threshold and a lower status threshold.

9. The system of claim 1, wherein to determine whether to perform the first follow-up action further comprises to:
look up a status in a reaction database;
receive an associated action from the reaction database; and
execute the associated action based at least in part on the status and the first power connector.

10. The system of claim 1, wherein the action is to:
electronically switch off power to the first power connector;
transmit an alert message; or
perform a time-delayed action.

11. A network service for infrastructure management, comprising:
an application program interface (API) configured to receive power data from a plurality of remote power monitoring devices and self-diagnostic data from self-diagnostic tests performed by the plurality of remote power monitoring devices to detect problems with components of the plurality of remote power monitoring devices themselves, wherein the components that are tested include a relay, wherein when a problem is detected in an affected component, the plurality of remote power monitoring devices to:
disable the affected component, and
bypass the affected component such that the plurality of remote power monitoring devices can continue operation;
storage for storing the received power data and the received self-diagnostic data; and
a processor unit coupled to the API and the storage, the processor unit configured to:
receive a set of power data from the API, the set of power data describing power draw of the plurality of remote power monitoring devices over a period of time;
process a classification of the remote power monitoring devices into one or more infrastructure subsets, the infrastructure subset identifying a group of devices that share an infrastructure planning purpose;
aggregate the set of power data to form subsets of power data based on the one or more infrastructure subsets of the remote power monitoring devices; and
render infrastructure planning data comprising at least some of the subsets of power data for display on a display device of a computing resource executing an infrastructure management application.

12. The network service of claim 11, wherein the infrastructure management application is a web-based application.

13. The network service of claim 11, wherein the infrastructure subsets are based on remote power monitoring devices with a same tag that share the infrastructure planning purpose or tagging power couplings of the remote power monitoring devices with a same tag that shares the infrastructure planning purpose, a tag being a customizable identifier of a remote power monitoring device.

14. A computer program product comprising a non-transitory computer-readable storage medium that stores instructions for execution by a processor to perform operations of a power monitoring equipment, the operations, when executed by the processor, to perform a method, the method comprising:
instructing an electronically configurable power connection to perform a self-diagnostic test to detect problems with components of the electronically configurable power connection itself, wherein the components that are tested include a relay, wherein when a problem is detected in an affected component, the electronically configurable power connection device to:
disable the affected component, and
bypass the affected component such that the electronically configurable power connection can continue operation;
detecting a power on event of a device electrically coupled to the electronically configurable power connection;
sampling energy consumption proximate to the power on event for a period and for the device electrically coupled to the electronically configurable power connection;
determining a power on signature from a set of power on signatures that matches the sampled energy consumption of the device proximate to the power on event;
determining a device identifier associated with the power on signature that matches the sampled energy consumption; and
determining the sampled energy consumption is above an upper status threshold and associating the first device with the first status of malfunctioning.

15. The computer program product of claim 14, wherein sampling energy consumption further comprises sampling instantaneous voltage, average voltage, instantaneous amperage, instantaneous wattage or average wattage.

16. The computer program product of claim 14, wherein the power on signature comprises a power profile, current profile, electronics signature, electronic waveform or device temperature.

17. The computer program product of claim 14, wherein the method further comprises transmitting an indicator of the device identifier to a network service.

18. The computer program product of claim 17, wherein the method further comprises receiving an action to implement from the network service based on the device identifier.

19. The computer program product of claim 18, wherein the action is performing periodic reporting, transmitting an alert, turning off the electronically configurable power connection or performing a time-delayed action.

20. A network service for company-assigned device auditing, comprising:
- an application program interface (API) configured to receive power data from a plurality of remote power monitoring devices and self-diagnostic data from self-diagnostic tests performed by the plurality of remote power monitoring devices to detect problems with components of the plurality of remote power monitoring devices themselves, wherein the components that are tested include a relay, wherein when a problem is detected in an affected component, the plurality of remote power monitoring devices to:
  - disable the affected component, and
  - bypass the affected component such that the plurality of remote power monitoring devices can continue operation;
- storage for storing the received power data and the self-diagnostic data; and
- a processor unit coupled to the API and the storage, the processor unit configured to:
  - associate a set of company-assigned models with an individual power monitoring device;
  - receive a set of power data from the API, the set of power data identifying device models drawing power from the plurality of remote power monitoring devices over a period of time based at least in part on a match between a sampled power usage and a device model power usage profile;
  - determine a set of detected device models coupled to the individual power monitoring device;
  - determine which of the set of detected device models matches a set of company-assigned models for the individual power monitoring device based at least in part on the set of power data;
  - provide a set of indications of confirmation that includes an indication of confirmation for each detected device model of the set of detected device models that matches an element of the set of company-assigned models for the individual power monitoring device; and
  - store audit data comprising the indications of confirmation, the set of detected device models and the set of company-assigned models to computer-readable media.

21. The apparatus of claim 20, wherein the API is further configured to also receive power usage, electrical data or metadata from the plurality of remote power monitoring devices.

22. The apparatus of claim 20, wherein a subset of power couplings of the plurality of remote power monitoring devices is associated with a set of inventory management tags, an inventory management tag stored locally on a remote power monitoring device.

23. The apparatus of claim 20, wherein the audit data is stored as a spreadsheet.

24. The apparatus of claim 23, wherein the spreadsheet comprises columns for the indications of confirmation, the set of detected device models and the set of expected models to computer-readable media for the plurality of remote power monitoring devices.

* * * * *